United States Patent
Wang

(10) Patent No.: US 7,927,890 B2
(45) Date of Patent: Apr. 19, 2011

(54) METHOD OF MANUFACTURING A SEMICONDUCTOR DEVICE

(75) Inventor: Wensheng Wang, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 26 days.

(21) Appl. No.: 12/140,508

(22) Filed: Jun. 17, 2008

(65) Prior Publication Data

US 2008/0311683 A1 Dec. 18, 2008

(30) Foreign Application Priority Data

Jun. 18, 2007 (JP) .................................. 2007-160032

(51) Int. Cl.
*H01L 21/00* (2006.01)

(52) U.S. Cl. ...... 438/3; 438/104; 438/240; 257/E21.208

(58) Field of Classification Search ............ 257/E21.208
See application file for complete search history.

(56) References Cited

U.S. PATENT DOCUMENTS

| | | | |
|---|---|---|---|
| 6,146,906 A | 11/2000 | Inoue et al. | |
| 6,500,678 B1 | 12/2002 | Aggarwal et al. | |
| 6,528,328 B1 | 3/2003 | Aggarwal et al. | |
| 6,548,343 B1 | 4/2003 | Summerfelt et al. | |
| 6,596,547 B2 | 7/2003 | Aggarwal et al. | |
| 6,635,497 B2 | 10/2003 | Aggarwal et al. | |
| 6,638,775 B1 * | 10/2003 | Kweon ............................ | 438/3 |
| 6,686,236 B2 | 2/2004 | Aggarwal et al. | |
| 6,872,669 B1 | 3/2005 | Summerfelt et al. | |
| 2002/0117700 A1 | 8/2002 | Fox | |
| 2003/0176073 A1 | 9/2003 | Ying et al. | |
| 2003/0222299 A1 * | 12/2003 | Miura ........................... | 257/306 |
| 2004/0195605 A1 * | 10/2004 | Maruyama et al. ........... | 257/295 |
| 2005/0118795 A1 | 6/2005 | Hidaka et al. | |

FOREIGN PATENT DOCUMENTS

| | | |
|---|---|---|
| EP | 1-113-484 A2 | 7/2001 |
| JP | 2000-091270 A | 3/2000 |
| JP | 2001-237392 A | 8/2001 |
| JP | 2002-151656 A | 5/2002 |
| JP | 2002-261251 A | 9/2002 |
| JP | 2003-218325 A | 7/2003 |
| JP | 2003-234345 A | 8/2003 |
| JP | 2003-282844 A | 10/2003 |
| JP | 2003-324101 A | 11/2003 |
| JP | 2004-253627 A | 9/2004 |
| JP | 2005-159165 A | 6/2005 |

* cited by examiner

*Primary Examiner* — Thanh Nguyen
(74) *Attorney, Agent, or Firm* — Westerman, Hattori, Daniels & Adrian, LLP

(57) ABSTRACT

A method of manufacturing a semiconductor device including forming a lower electrode over a substrate, increasing the temperature of the substrate with the lower electrode to a predetermined temperature under mixture gas atmosphere of inert gas and oxygen gas, forming a dielectric film on the lower electrode by using an organic metal raw material after the temperature reaches the predetermined temperature, and forming an upper electrode on the dielectric film.

18 Claims, 29 Drawing Sheets

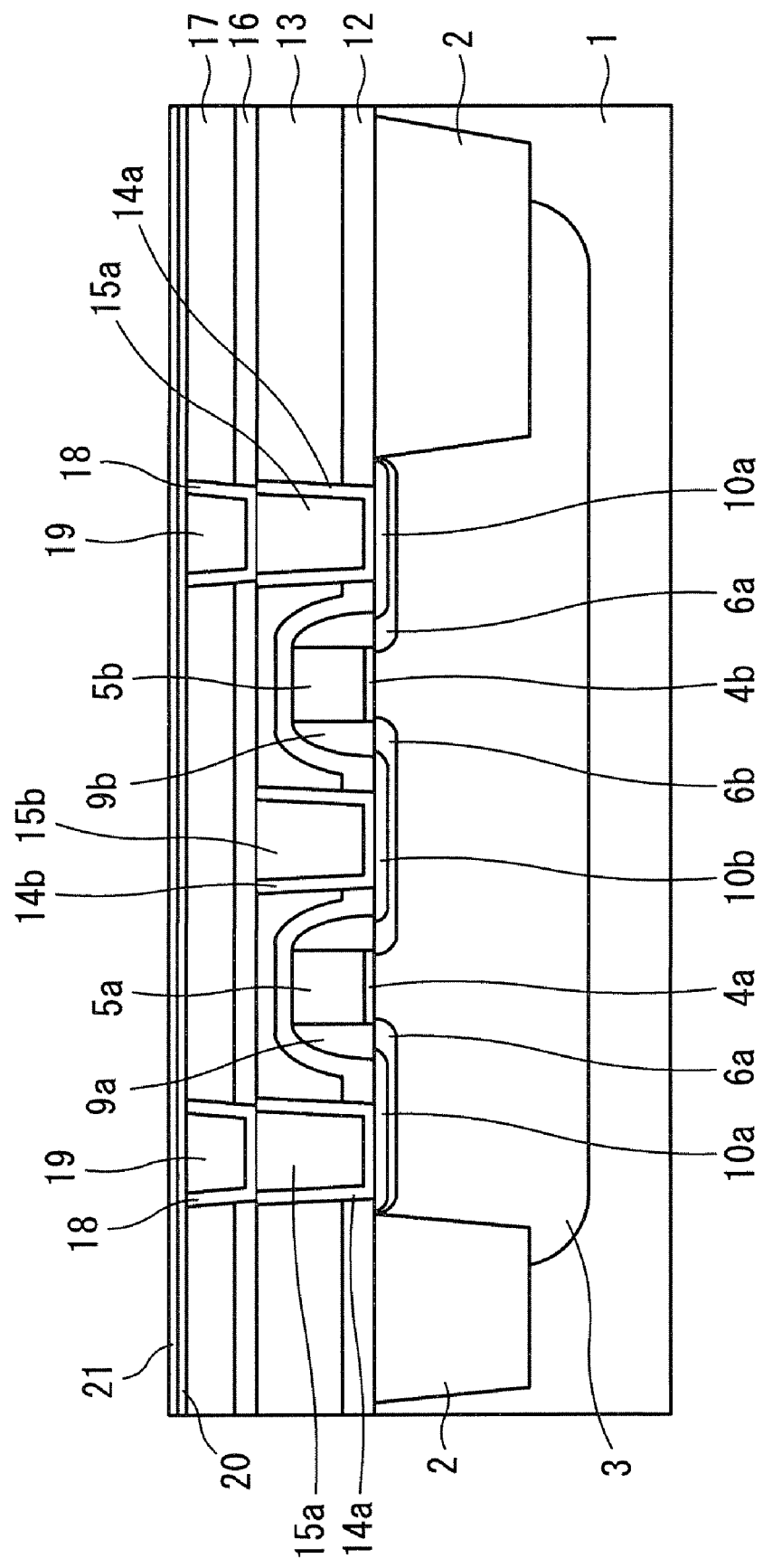

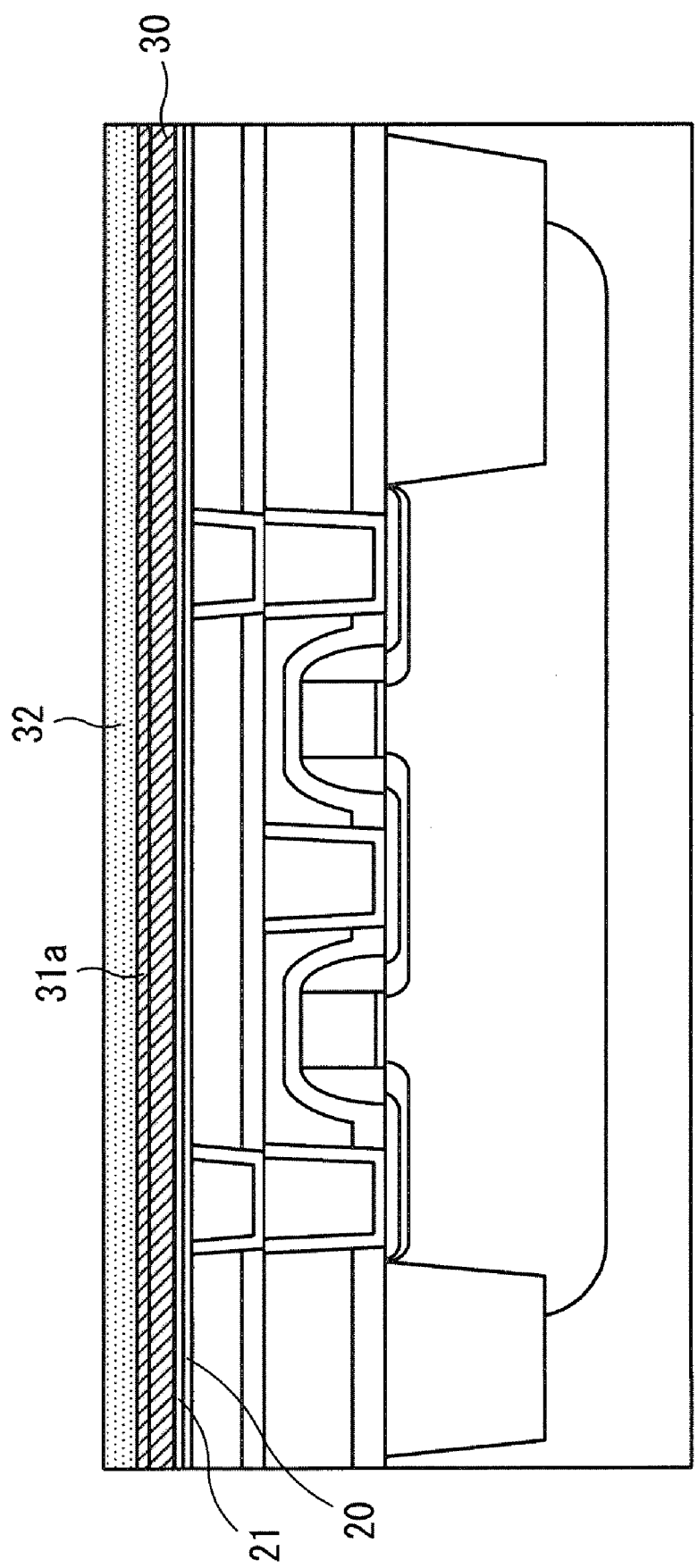

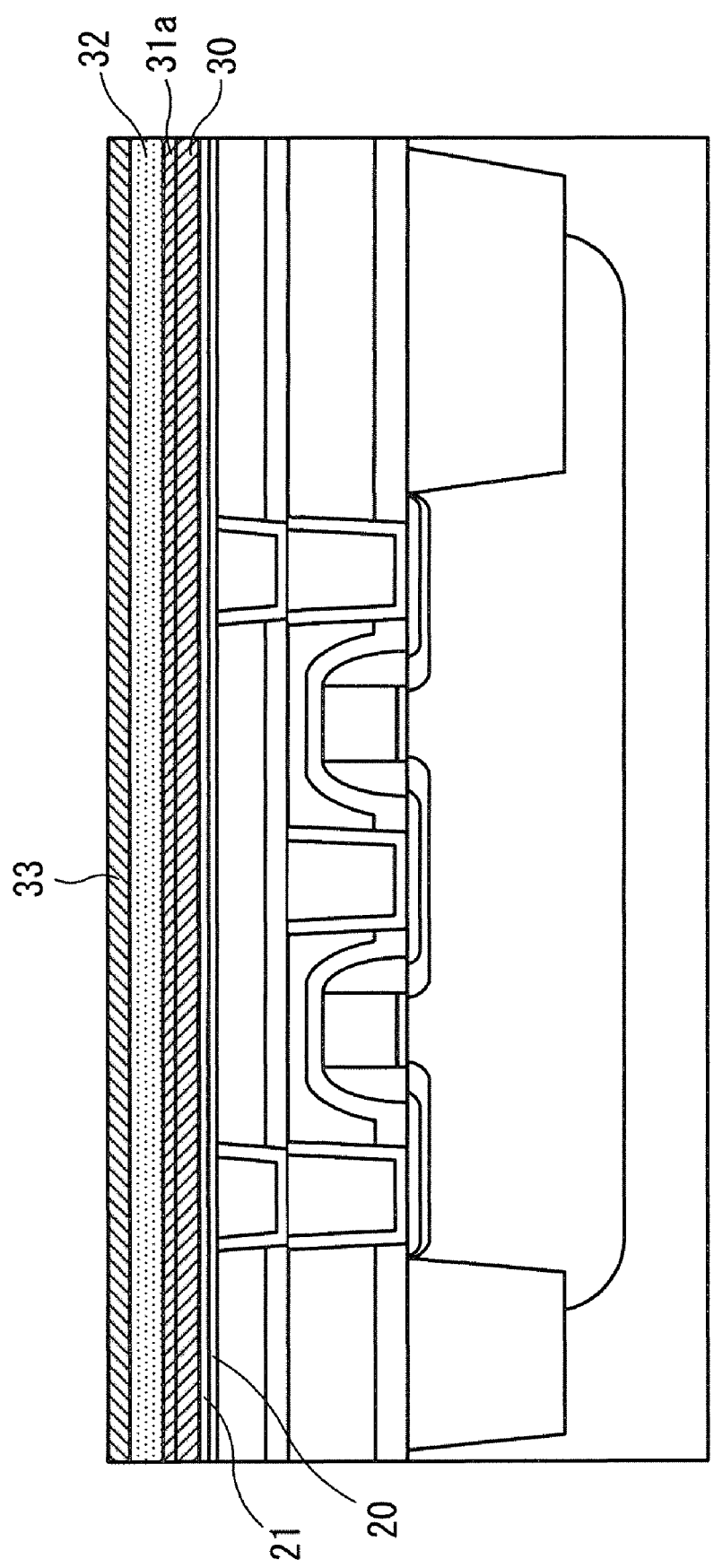

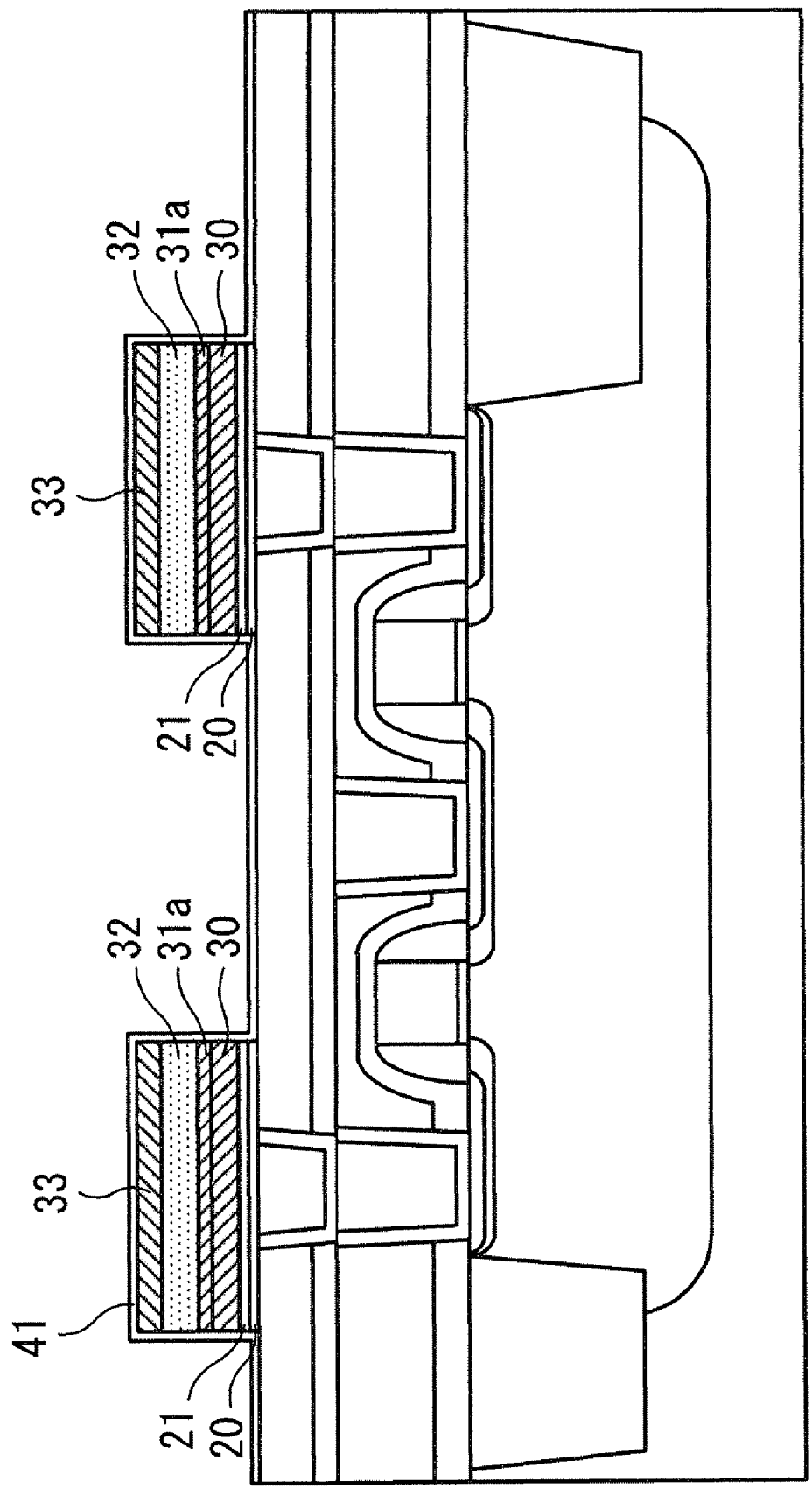

METHOD OF MANUFACTURING A SEMICONDUCTOR DEVICE

TECHNICAL FIELD

The present invention relates to a semiconductor device manufacturing method, and particularly to a method of manufacturing a semiconductor device having a dielectric capacitor.

BACKGROUND

In connection with developments of digital technologies, a tendency to process or store a large amount of data at high speed has been recently promoted. Therefore, high integration and high performance have been required to semiconductor devices used in electronic equipments.

With respect to semiconductor storage devices, for example, studies on techniques using ferroelectric materials or high dielectric constant materials as a capacitance insulating film in place of a conventional silicon oxide (SiO) film or a silicon nitride (SiN) film have been started in order to implement high integration of a Dynamic Random Access Memory (DRAM).

A flash memory and a Ferro-electric Random Access Memory (FeRAM) are known as non-volatile memories in which storage information is not vanished even when power is interrupted.

The flash memory has the structure that a floating gate is embedded in a gate insulating film of an insulating gate type electric field effect transistor (IGFET), and stores information by accumulating charges in the floating gate. It is necessary to use tunnel current passing through the insulating film for writing/deletion of information, and it needs a relatively high voltage.

The FeRAM uses a ferroelectric film as a capacitance insulating film, and has a ferroelectric capacitor in which the ferroelectric film is sandwiched by a pair of electrodes. The ferroelectric capacitor is polarized in accordance with a voltage applied between the electrodes, and it has spontaneous polarization even when the applied voltage is removed. The ferroelectric capacitor also inverts the polarity of the spontaneous polarization if the polarity of the voltage applied between the electrodes inverts. The FeRAM detects this spontaneous polarization to thereby read out information. The FeRAM operates with a lower voltage as compared with the flash memory, and high-speed writing can be performed with saved power. A System On Chip (SOC) adopting the FeRAM has been considered as an application of IC cards, etc.

For example, a lead zirconate titanate (PZT), a Bi layer structure compound such as a strontium bismuth tantalite ($SrBi_2Ta_2O_9$) or the like are used as the ferroelectric film used for the FeRAM. It is formed by using a sol-gel method, a sputtering method, a Metal Organic Chemical Vapor Deposition (MOCVD) method or the like. When the sol-gel method is used to form the ferroelectric film and also when the sputtering method is used to form the ferroelectric film, amorphous or microcrystal ferroelectric film is formed on the lower electrode, and then subjected to heat treatment to change the crystal structure to the perovskite structure or the Bi layer structure. When the MOCVD method is used to form the ferroelectric film, the crystal structure of the perovskite structure or the Bi layer structure is obtained in the forming process because it is formed at high temperature.

Furthermore, it is necessary that material which is hardly oxidizable or material which keeps electrical conductivity even when it is oxidized is used for the electrodes of the ferroelectric capacitor. In general, metal elements of the platinum group such as platinum (Pt), iridium (Ir), iridium oxide ($IrO_x$), etc. and other oxides are broadly used.

It is general to use aluminum (Al) as the wire material of the FeRAM as in the case of normal semiconductor devices.

Higher integration and higher performance have been also required to the FeRAM as in the case of other semiconductor devices, and it will be required in the future to reduce the cell area. The structure of the FeRAM is roughly classified into two types of structures, a planar structure and a stack structure, however, in order to reduce the cell area, it is effective to adopt the stack structure. In FeRAM having the stack structure, barrier metal, a lower electrode, a ferroelectric film and an upper electrode are stacked immediately over a plug connected to the source-drain region of a transistor in this order to form a ferroelectric capacitor. The barrier metal serves to prevent oxidation of the plug. It has been recently frequent that the lower electrode also has the function of the barrier metal, and it has been impossible to clearly separate these elements from each other. Material such as titanium nitride (TiN), titanium aluminum nitride (TiAlN), Ir, $IrO_2$, Pt, strontium ruthenate ($SrRuO_3$(SRO)) or the like is used for the portions corresponding to the barrier metal and the lower electrode.

In order to form the FeRAM having an excellent electrical characteristic and a high process yield, it is important to control the orientation of the ferroelectric film constituting the ferroelectric capacitor so that the orientation is as uniform as possible. The orientation of the lower electrode for the ferroelectric film affects the orientation of the ferroelectric film materially. Accordingly, by controlling the orientation of the lower electrode so that the orientation concerned is as uniform as possible, the orientation of the ferroelectric film formed on the lower electrode can be enhanced.

For example, a method of using a stack structure of $IrO_2$(30 nm)/Ir (30 nm)/Ti(30 nm)/TiN(50 nm) at the portions corresponding to the lower electrode and the barrier metal has been hitherto proposed (for example, see Japanese Laid-open Patent Publication No. 2005-159165).

When the lower electrode is formed of Ir and $IrO_x$, a method of forming an Ir film at 400° C. to 550° C. and forming an $IrO_x$ film at 530° C. to 550° C. by the sputtering method (for example, see Japanese Laid-open Patent Publication No. 2001-237392) and a method using an $IrO_2$ film in which $IrO_2$/Ir is equal to 10 or more in X-ray diffraction intensity are also proposed (for example, see Japanese Laid-open Patent Publication No. 2002-151656). Furthermore, a method of continuously forming the $IrO_2$/Ir stack structure by the sputtering method is also proposed (for example, see Japanese Laid-open Patent Publication No. 2000-91270).

Furthermore, (1) a method of forming an $IrO_2$ film on an Ir film, (2) a method of forming a crystalline $IrO_2$ film on an Ir film, forming an amorphous $IrO_2$ film on the crystalline $IrO_2$ film, reducing the amorphous $IrO_2$ film in the formation process of a PZT film by the MOCVD method, and then oxidizing a reduced amorphous $IrO_2$ film again (3) forming an oxygen-added Ir film on an Ir film, (4) forming an $IrO_2$ film on an Ir film, forming an Ir film on the $IrO_2$ film, and diffusing oxygen into the Ir film in the forming process of a PZT film by the MOCVD method, etc. have been also proposed (for example, see Japanese Laid-open Patent Publication No. 2003-282844, U.S. Pat. No. 6,500,678, U.S. Pat. No. 6,528, 328, U.S. Pat. No. 6,548,343, U.S. Pat. No. 6,596,547, U.S. Pat. No. 6,635,497, U.S. Pat. No. 6,686,236, U.S. Pat. No. 6,872,669).

Furthermore, a method of forming an Ir film, thermally oxidizing the Ir film to form a crystalline $IrO_2$ film on a surface layer portion of the Ir film, and changing the crystalline $IrO_2$ film to an amorphous Ir film in the forming process of a PZT film by the MOCVD method has been proposed (for example, see Japanese Laid-open Patent Publication No. 2004-253627).

Furthermore, with respect to the method of forming the ferroelectric film, a method of conducting a Rapid Thermal Annealing (RTA) treatment under the mixture gas atmosphere of Ar gas and oxygen ($O_2$) gas after a PZT film is formed under argon (Ar) gas atmosphere by the sputtering method, thereby crystallizing the PZT film and also forming a PZT film on the crystallized PZT film by MOCVD method has been proposed (for example, see Japanese Laid-open Patent Publication No. 2003-218325). Furthermore, there has been also proposed a method in which when a ferroelectric film is formed by the MOCVD method, the temperature is increased under an inert gas atmosphere until the temperature increases to the formation temperature, and then the ferroelectric film is formed by using gas containing $O_2$ gas and raw material gas (for example, see Japanese Laid-open Patent Publication No. 2003-234345) and a method of changing the concentration of $O_2$ gas between the initial stage and the later stage of the formation of the ferroelectric film (for example, see Japanese Laid-open Patent Publication No. 2003-324101).

Furthermore, a method of forming an amorphous $IrO_x$ film on the upper electrode to protect PZT film from chemical/mechanical deterioration (for example, see Japanese Laid-open Patent Publication No. 2002-261251), etc. have been also proposed.

However, it has been difficult in the conventional techniques to control the orientation of the PZT film.

SUMMARY

A method of manufacturing a semiconductor device according to an aspect of the present invention forming a lower electrode over a substrate, increasing the temperature of the substrate with the lower electrode to a predetermined temperature in a mixture gas atmosphere of inert gas and oxygen gas, forming a dielectric film with an organic metal raw material on the lower electrode after the temperature reaches the predetermined temperature, and forming an upper electrode on the dielectric film.

BRIEF DESCRIPTION OF THE DRAWINGS

FIGS. 6A to 6I are diagrams showing a part of a manufacturing process of a semiconductor device according to a first embodiment;

DETAILED DESCRIPTION OF THE EMBODIMENTS

For example, when a lower electrode is formed of an Ir film and a PZT film is formed as a ferroelectric film on the lower electrode by a MOCVD method, this formation is generally performed at a high temperature of 600° C. or more. In this case, a wafer which has been treated until the formation of the Ir film whose orientation is controlled is set in a chamber, and the temperature is increased to a target temperature under Ar gas atmosphere or $O_2$ gas atmosphere. Thereafter, raw material gas is introduced into the chamber, and the PZT film is formed on the Ir film. From the viewpoint of productivity and polarization, the PZT film is preferably formed so as to be preferentially oriented to the (111). Accordingly, it is preferable that the Ir film serving as the base of the PZT film is formed so that the (111) thereof is preferentially oriented.

However, when the temperature is increased under Ar gas atmosphere in the process of forming the PZT film by the MOCVD method, there has been found a problem that not only the (111), but also the (100) and the (101) are generated in the formed PZT film, and the intensity ratio of the (111) is lowered, so that the electrical characteristic (switching charge amount) of the ferroelectric capacitor is lowered.

When the temperature is increased under $O_2$ gas atmosphere in the process of forming the PZT film by the MOCVD method, some problems have also been found. That is, as a first problem, when the formation of the PZT film is conducted continuously on plural wafers, the intensity ratio of the (111) (or (222)) thereof is liable to be dispersed among the plural wafers.

Figure 1:
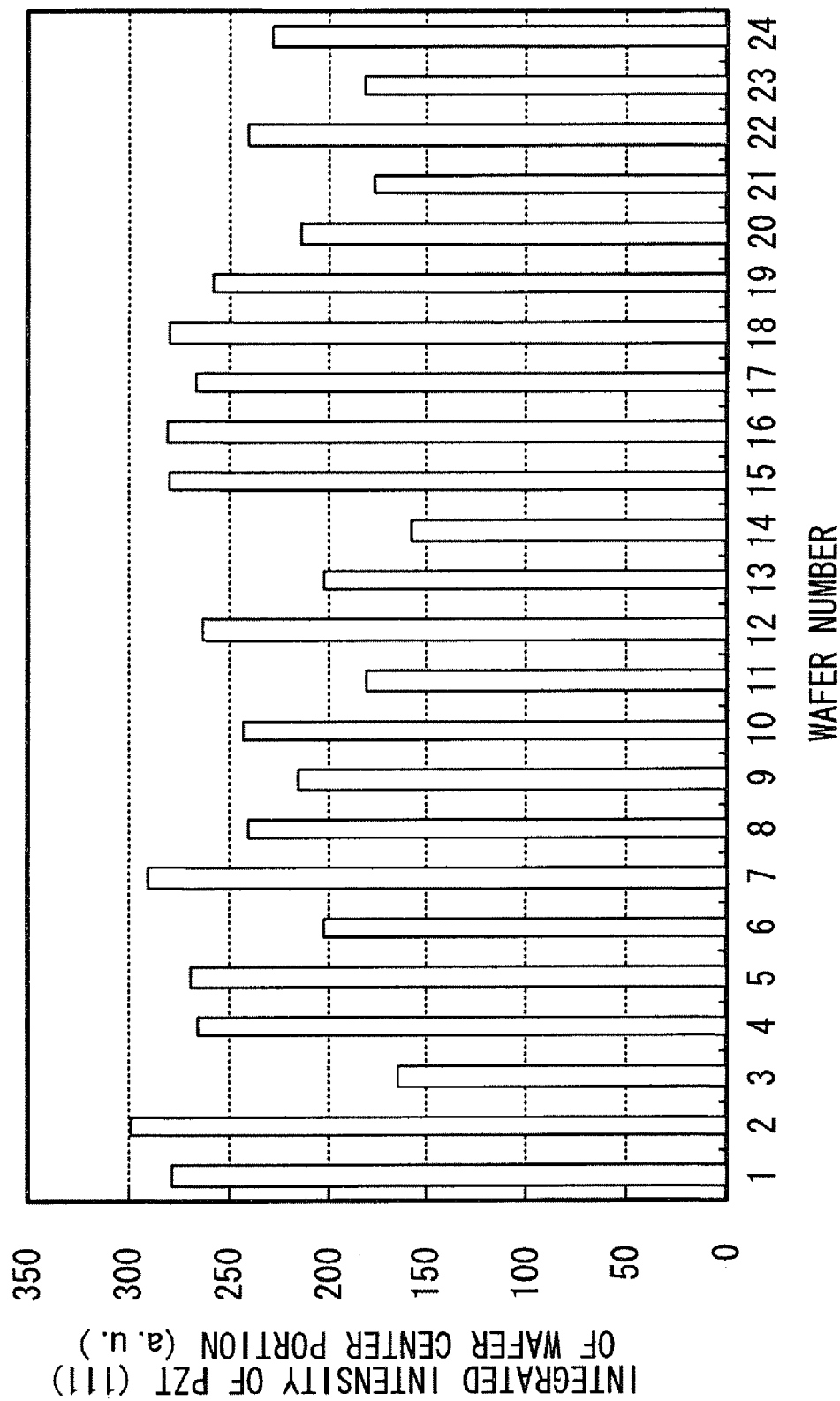
FIG. 1 is a diagram showing the integrated intensity of the PZT (111) of a wafer center portion.
Figure 2:
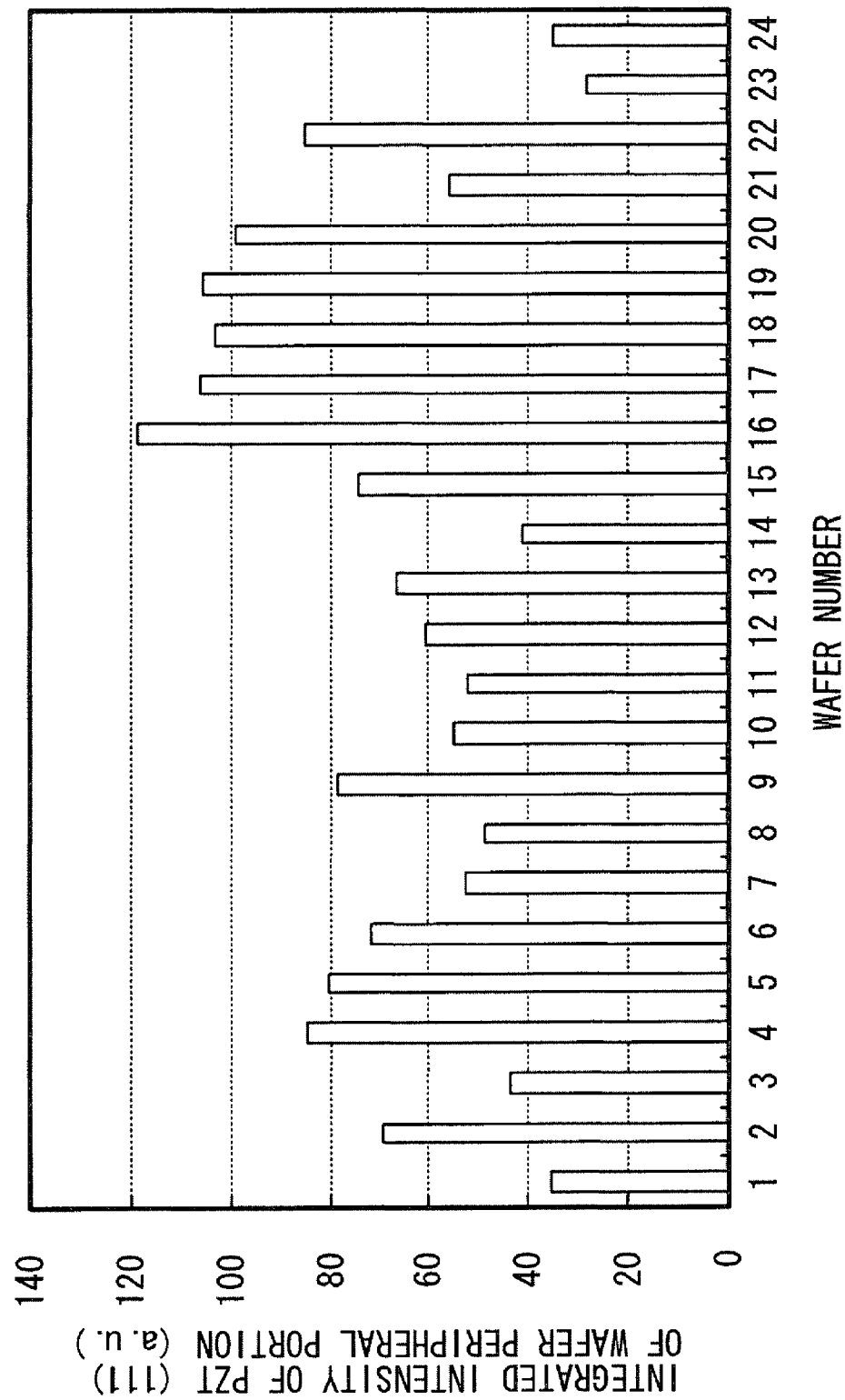
FIG. 2 is a diagram showing the integrated intensity of the PZT (111) of a wafer peripheral portion.
Figure 3:
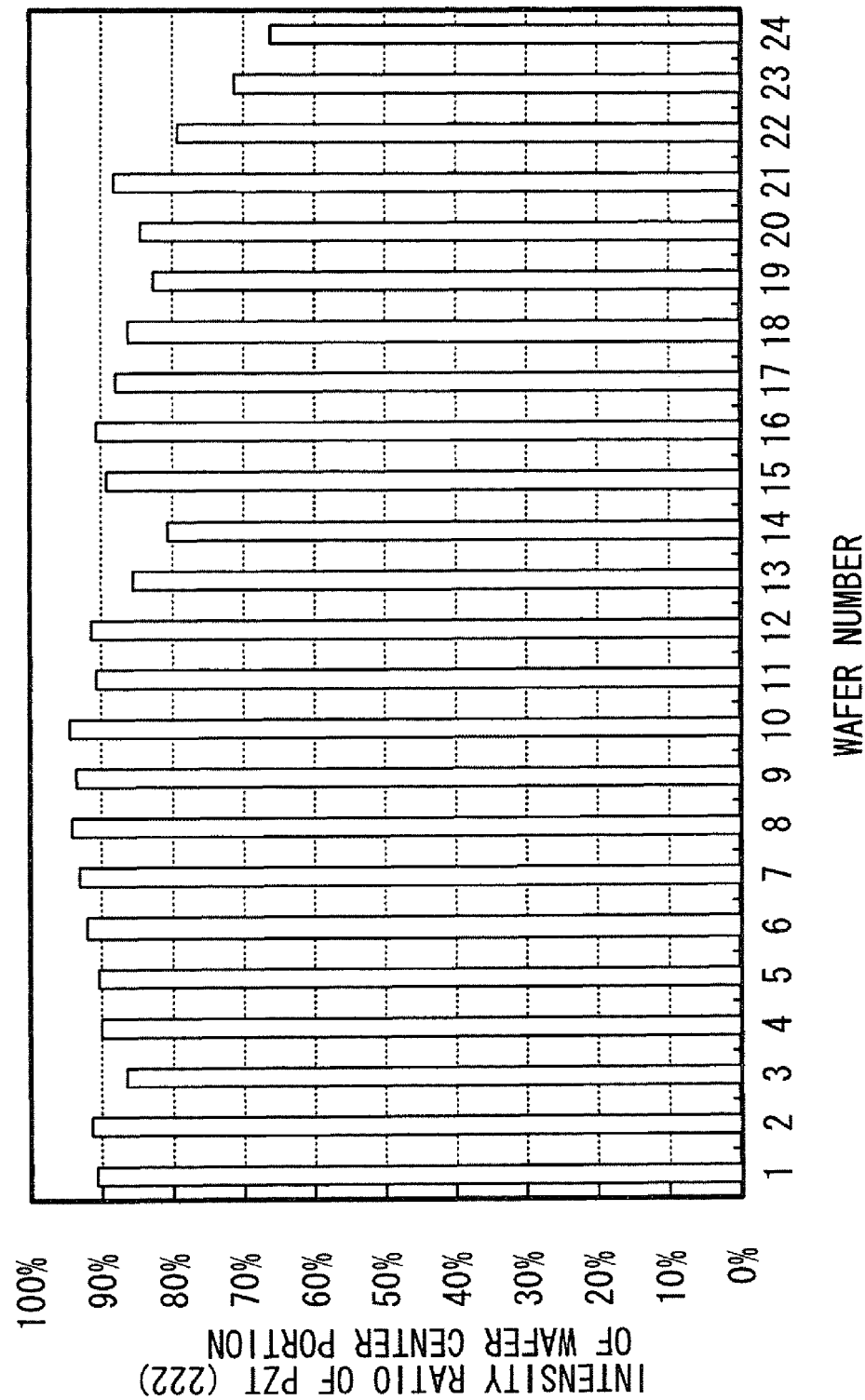
FIG. 3 is a diagram showing the intensity ratio of the PZT (222) of the wafer center portion.
Figure 4:
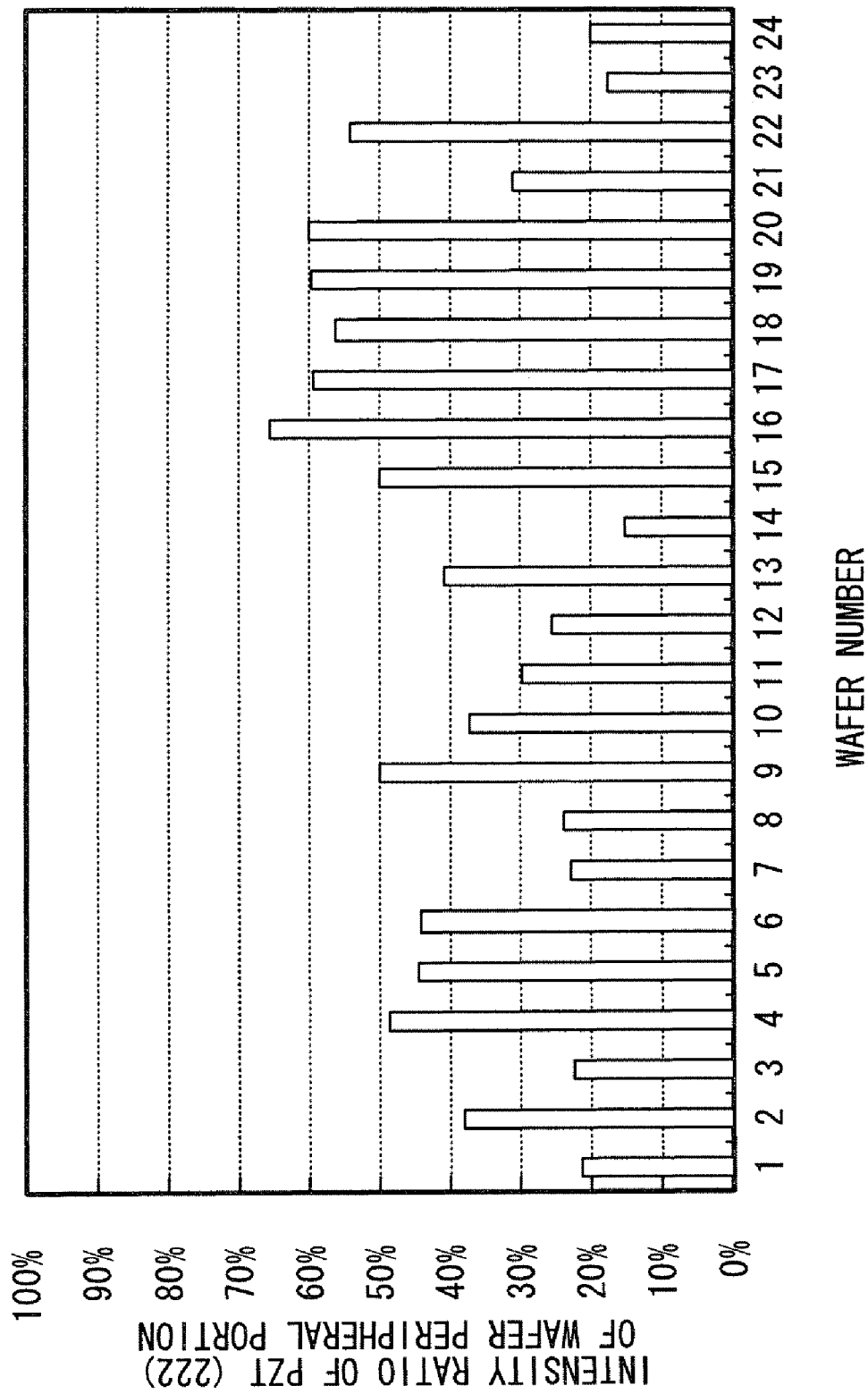
FIG. 4 is a diagram showing the intensity ratio of the PZT (222) of the wafer peripheral portion.

Here, FIGS. 1 to 4 are diagrams showing investigation results of orientations of respective PZT films formed on plural wafers. FIG. 1 is a graph showing the integrated intensity of the PZT (111) of the wafer center portion, FIG. 2 is a graph showing the integrated intensity of the PZT (111) of the wafer peripheral portion, FIG. 3 is a graph showing the intensity ratio of the PZT (222) of the wafer center portion, and FIG. 4 is a graph showing the intensity ratio of the PZT (222) of the wafer peripheral portion.

The intensity ratio of the PZT (222) is calculated according to the following equation (1).

The intensity ratio (%) of the PZT(222) {the integrated intensity of the PZT(222)}/{the integrated intensity of the PZT(100)+the integrated intensity of the PZT(101)+the integrated intensity of the PZT(222)}×100. (1)

In this equation (1), the integrated intensity of the PZT (222) (the PZT(111)) and the integrated intensities of the PZT(100) and the PZT(101) are calculated from a measurement result based on an X-ray diffraction apparatus.

When the temperature is increased under $O_2$ gas atmosphere in the process of continuously forming the PZT film on plural wafers by the MOCVD method, the integrated intensity of the PZT (111) is greatly dispersed among the plural wafers irrespective of the wafer center portion or the wafer peripheral portion. The intensity ratio of the PZT (222) is unstable and low, and extremely low particularly at the wafer peripheral portion as shown in FIGS. 3 and 4.

As a second problem when the temperature is increased under $O_2$ gas atmosphere in the process of forming the PZT film by the MOCVD method, the surface of the formed PZT film is liable to be rough. Particularly at the wafer peripheral portion, very large surface roughness, so-called white turbidity is liable to occur.

These problems occur because the Ir film of the lower electrode is oxidized by $O_2$ gas when the temperature is increased under $O_2$ gas atmosphere. In principle, the $IrO_x$ film formed by the oxidation can be reduced to the Ir film again by a solvent component (for example, tetrahydrofuran (THF), butyl acetate or the like) in the raw material gas which is introduced subsequently to the temperature increase. However, in the temperature increasing process under $O_2$ gas atmosphere, abnormal oxidation of the Ir film is liable to occur, and when the $IrO_x$ film formed by such abnormal oxidation is reduced by the solvent component in the raw material gas, the orientation of the Ir film after it is reduced gets worse, so that the orientation of the PZT film formed on the Ir film gets worse.

Figure 5:
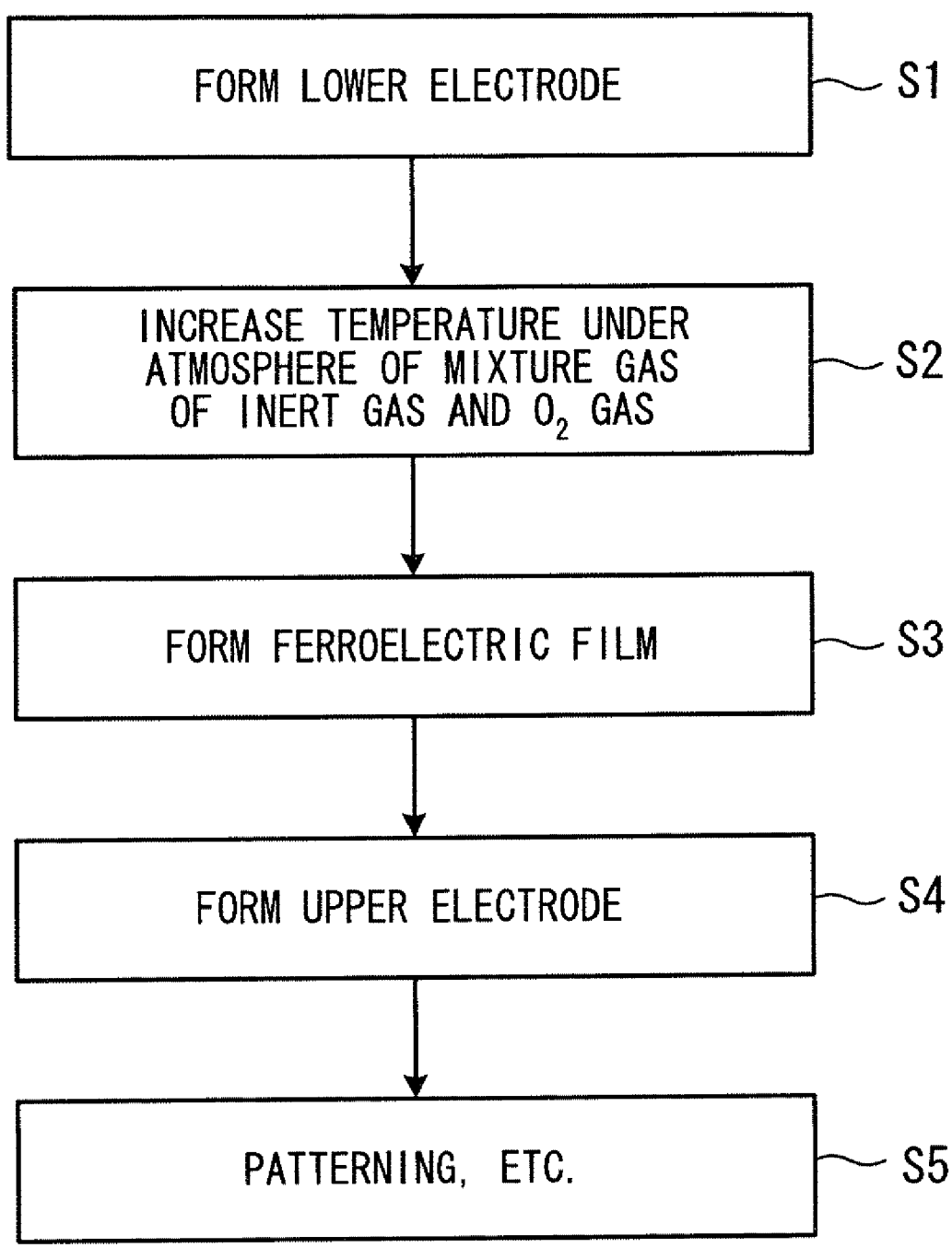
FIG. 5 is a flow chart showing an example of a method of forming a ferroelectric capacitor of a first embodiment.

FIG. 5 is a flow chart showing an example of the method of forming a ferroelectric capacitor.

The ferroelectric capacitor comprises a lower electrode which is electrically connected to a transistor formed on a semiconductor substrate (for example, formed on a plug connected to a transistor), a ferroelectric film formed on the lower electrode and an upper electrode formed on the ferroelectric film.

When such a ferroelectric capacitor is formed, the lower electrode is formed under such a condition that a predetermined crystal face is preferentially oriented (step S1).

As the lower electrode, a noble metal film of Ir, rhodium (Rh), palladium(Pd), ruthenium (Ru) or the like, or a laminate layer of two or more layers of noble metal film as described above may be used. Or, an alloy film containing two or more kinds of Ir, Rh, Pd, Ru or a laminate layer of two or more layers of the alloy film as described above may be used.

A metal oxide film may be formed on the metal film as described above, and reduced in a ferroelectric film forming process described later to thereby form a lower electrode. As the metal oxide film, a noble metal oxide film of Ir, Rh, Pd, Ru or the like, or a laminate layer of two or more layers of the noble metal oxide film as described above may be used. Or, an alloy oxide film containing two or more kinds of Ir, Rh, Pd, Ru or a laminate layer of two or more layers of the alloy oxide film as described above may be used.

When the metal oxide film is formed as described above, in consideration of the reducing performance in the ferroelectric film forming process, the orientation of the ferroelectric film obtained on the metal oxide film, etc., it is preferable the metal oxide film is formed under the amorphous or microcrystal state rather than under the perfect crystal state so that the fill thickness thereof is thinner than that of the metal film serving as the base. In this invention, an imperfect crystal state in which amorphous and crystal grains are mixed with each other is referred to as "microcrystal".

After the lower electrode is formed, the ferroelectric film is formed by the MOCVD method (steps S2, S3).

As the material of the ferroelectric film, not only PZT, but also La-doped PZT (PLZT), PZT-based material doped with a minute amount of calcium (Ca), strontium (Sr), silicon (Si) or the like, Bi layer structure component such as SBT, strontium bismuth tantalate niobate ($SrBi_2(Ta, Nb)_2O_9$ (SBTN)) or the like may be used.

In the process of forming the ferroelectric film by the MOCVD method, the wafer in which the lower electrode has been formed is set in the chamber, and the temperature is increased to a predetermined temperature under a predetermined atmosphere (step S2). After the temperature reaches the predetermined temperature, the atmosphere in the chamber is adjusted, the raw material gas of the ferroelectric film is introduced into the chamber, and the ferroelectric film is formed (step S3). The raw material gas contains not only organic metal raw material component, but also solvent component of the organic metal raw material such as THF, butyl acetate or the like.

At the formation stage of the ferroelectric film of steps S2 and S3 as described above, the temperature increase of step S2 is carried out under a mixture gas atmosphere of inert gas such as Ar gas, nitrogen ($N_2$) gas or the like and $O_2$ gas which is controlled to a predetermined rate.

When the temperature is increased under 100% inert gas atmosphere, the surface of the lower electrode before the introduction of the raw material gas is liable to vary nonuniformly at the temperature increasing time. When the temperature is increased under 100% $O_2$ gas atmosphere, the surface of the lower electrode is liable to be abnormally oxidized dependently on the structure of the lower electrode at the temperature increasing time. Even when the raw material gas is afterwards introduced, such a surface is hardly uniformly reduced by the solvent component in the raw material gas. Therefore, under both atmospheres, the in-plane orientation distribution of the wafer and the inter-wafer reproducibility are bad in the ferroelectric film formed by introducing the raw material gas after the temperature increase.

On the other hand, when the temperature is increased under the atmosphere obtained by mixing inert gas with a predetermined rate of $O_2$ gas as described above, the surface of the lower electrode is liable to be uniformly oxidized irrespective of the structure of the lower electrode. The surface of the lower electrode which is uniformly oxidized as described above is liable to be uniformly reduced by the solvent component in the raw material gas when the raw material gas is subsequently introduced. The ferroelectric film which has excellent orientation, an excellent in-plane orientation distribution of the wafer and inter-wafer reproducibility is formed on the oxidized/reduced lower electrode by the organic metal raw material component in the raw material gas.

In step S1, when the lower electrode is designed to have the stack structure of the metal film and the amorphous or microcrystal metal oxide film, the lower electrode surface is more uniformly oxidized/reduced by the temperature increase under the mixture gas atmosphere of inert gas and $O_2$ gas and the subsequent introduction of the raw material gas as compared with the case where the amorphous or microcrystal metal oxide film is not formed. Therefore, the orientation of the formed ferroelectric film is remarkably excellent, and the in-plane orientation distribution of the wafer and the inter-wafer reproducibility can be enhanced.

The formation of the ferroelectric film by the MOCVD method step S3, subsequent to the temperature increase of step S2, is performed under different conditions between the initial stage (initial layer forming stage) and the subsequent stage (core layer forming stage).

For example, the raw material gas of the ferroelectric film to be formed is introduced under the mixture gas atmosphere of inert gas of Ar gas or the like and $O_2$ gas which is controlled to a predetermined rate is introduced at the initial layer forming stage. The organic metal raw material component in the raw material gas reacts with $O_2$ gas to be decomposed and oxidized, so that crystallized ferroelectric film is deposited on the lower electrode.

The $O_2$ gas rate in the mixture gas atmosphere at the initial layer forming stage is controlled so that the $O_2$ amount in the chamber is smaller than the $O_2$ amount required to react with the organic metal raw material component. The $O_2$ amount required to react with the organic metal raw material component corresponds to the sum of the $O_2$ amount required to generate carbon dioxide ($CO_2$) and water ($H_2O$) by burning carbon (C) and hydrogen (H) originating from the organic metal raw material component and the $O_2$ amount required to crystallize the ferroelectric film formed from the organic metal raw material component.

At the initial layer forming stage, the raw material gas is introduced under the state that the $O_2$ amount is lacking as described above, so that the organic metal raw material component in the raw material gas reacts with $O_2$ gas in the mixture gas atmosphere to be decomposed/oxidized, and also it robs O in the lower electrode and reacts with O to be decomposed/oxidized. Therefore, at this stage, the lower electrode can be perfectly reduced simultaneously with the formation of the initial layer.

On the other hand, at the core layer forming stage, the raw material gas of the ferroelectric film to be formed is introduced under the 100% $O_2$ gas atmosphere. The $O_2$ gas rate in the mixture gas atmosphere at this core layer forming stage is controlled so that the $O_2$ amount in the chamber is larger than the $O_2$ amount required to react with the organic metal raw material component. At the core layer forming stage, the raw material gas is introduced under the state that the $O_2$ amount is excessive, and the organic metal raw material component in the raw material gas reacts with $O_2$ gas in the mixture gas atmosphere to be decomposed/oxidized. Therefore, the core layer having little oxygen depletion can be formed.

After the ferroelectric film is formed by the MOCVD method, if needed, another ferroelectric film may be formed by using the sputtering method or the sol-gel method.

After the ferroelectric film is formed, the upper electrode is formed on the ferroelectric film (step S4). Thereafter, patterning and formation of protection film (hydrogen and water blocking film) are conducted on the laminate body of the lower electrode, the ferroelectric film and the upper electrode (step S5), thereby constituting the ferroelectric capacitor.

Subsequently, an interlayer insulating film, a plug, wires, etc. may be formed according to a normal method, thereby completing an FeRAM. The ferroelectric film of the ferroelectric capacitor is normally subjected to a predetermined heat treatment at a proper stage for the purpose of recovering from damage applied in the process of forming the FeRAM.

According to the flow chart of the method of forming the ferroelectric capacitor shown in FIG. 5, the orientation of the ferroelectric film can be enhanced. Furthermore, the in-plane orientation distribution of the wafer can be enhanced, and the dispersion among wafers can be suppressed. Accordingly, the ferroelectric capacitor having a high switching charge amount and a high reliability can be obtained, so that a high-performance and high-reliability FeRAM can be implemented.

A specific example of the FeRAM formation using the principle as described above will be described.

First, a first embodiment will be described.

FIGS. 6A to 6I are diagrams showing the respective FeRAM forming steps. These steps will be described successively.

FIG. 6A is a schematic cross-sectional view of the main part after the process till the formation of the base of the lower electrode is completed.

First, a Shallow Trench Isolation (STI) 2 for defining an active region of a transistor is formed on an n-type or p-type Si substrate 1. In place of STI 2, an element-separating region may be formed according to a Local Oxidation of Silicon (LOCOS) method.

Subsequently, p-type impurities are doped into the active region of the Si substrate 1 to form a p-well 3, and then the surface of the active region is thermally oxidized. After the thermal oxidation, an amorphous or polycrystalline Si film is formed on the whole surface, and subjected to patterning, thereby forming a gate insulating film 4a, 4b and gate electrodes 5a, 5b.

Subsequently, n-type impurities are ion-implanted by using the gate electrodes 5a, 5b as masks to form first and second source-drain extension regions 6a and 6b in the Si substrate 1 at both sides of each of the gate electrodes 5a, 5b. Thereafter, an insulting film such as a SiO film or the like is formed on the whole surface by the CVD method, and then etched back, whereby side walls 9a and 9b are formed at the respective gate electrodes 5a, 5b. Then, n-type impurities are ion-implanted by using the gate electrodes 5a, 5b and the side walls 9a, 9b as masks, whereby first and second source drain regions 10a and 10b are formed in the Si substrate 1 at both sides of the gate electrodes 5a, 5b.

Through the above steps, two Metal Oxide Semiconductor (MOS) transistors are formed in the active region of the Si substrate 1.

Subsequently, a metal film of high melting point, such as cobalt (Co) or the like, is formed on the whole surface by the sputtering method and heated, whereby the surfaces of the first and second source-drain regions 10a and 10b and the gate electrodes 5a and 5b are subjected to silicide formation. Thereafter, a silicon oxide nitride (SiON) film of 200 nm in thickness is formed on the whole surface by the plasma CVD method to form a cover insulating film 12, and a SiO film (first interlayer insulating film) 13 of 1000 nm in film thickness is formed on the cover insulating film 12 by the plasma CVD method using tetraethoxy silane (TEOS) gas. The upper surface of the first interlayer insulating film 13 is polished and flattened by the Chemical Mechanical Polishing (CMP) method. After the flattening process, the film thickness of the first interlayer insulating film 13 is set to 700 nm from the flattened surface of the Si substrate 1.

Subsequently, patterning is conducted on the first interlayer insulating film 13 and the cover insulating film 12 by photolithography to form contact holes of 0.25 µm in diameter which extend to the first and second source-drain regions 10a, 10b. After a Ti film of 30 nm in film thickness and a TiN film of 20 nm in film thickness are formed on the whole surface, a tungsten (W) film of 300 nm in film thickness is formed by the CVD method, and needless W film, TiN film and Ti film are removed by the CMP method. Accordingly, W plugs 15a, 15b are formed through an adhesion film (glue film) 14a, 14b formed of the Ti film and the TiN film in the contact holes.

This CMP step uses such slurry (for example, SSW2000 produced by Cabot Microelectronics Corporation) that the polishing speed of the W film, the TiN film and the Ti film is higher than that of the first interlayer insulating film 13 as a base. The polishing amount of the CMP is set to be larger than the total film thickness of the respective films for the purpose of over-polishing, so that no polishing residue occurs on the first interlayer insulating film 13.

Subsequently, a SiON film (oxidation preventing film) 16 of 130 nm in film thickness is formed on the whole surface by the plasma CVD method, and a SiO film (second interlayer insulating film) 17 of 300 nm in film thickness is further formed on the SiON film by the plasma CVD method using a TEOS as raw material. The oxidation preventing film 16 may be formed of a SiN film or an aluminum oxide (ALO) film in place of the SiON film. Thereafter, a contact hole is formed so as to penetrate through the second interlayer insulating film 17 and the oxidation preventing film 16 and extend to the W plug 15a connected to the first source-drain region 10a, and glue film 18 and a W plug 19 are formed in the contact hole as in the case of the glue film 14a, 14b and the W plugs 15a, 15b.

Subsequently, an ammonia ($NH_3$) plasma treatment is conducted on the surface after the glue film 18 and the W plug 19 are formed. By the $NH_3$ plasma treatment concerned, NH-groups are bonded to O-atoms of the surface of the second interlayer insulating film 17. Accordingly, even when a Ti film is formed on the second interlayer insulating film 17 as described later, Ti-atoms are not captured by O-atoms and freely move in the surface of the second interlayer insulating film 17. As a result, the Ti film which is self-assembled so as to preferentially orient the (002) can be formed on the second interlayer insulating film 17.

The $NH_3$ plasma treatment is executed by using a parallel flat-plate type plasma treatment device having a counter electrode which is located so as to be spaced from a wafer to be treated at 9 mm, for example. In the $NH_3$ plasma treatment, under pressure of 266 Pa, $NH_3$ gas is supplied at 350 sccm into a chamber in which the substrate temperature is kept to 400° C., high-frequency of 13.56 MHz is applied to the treatment target wafer side by 100 W power and high-frequency of 350 kHz is supplied to the counter electrode for 60 seconds by 55 W power.

After the $NH_3$ plasma treatment as described above, the substrate temperature is set to 20° C. and sputtering power of 2.6 kW is supplied for five seconds under Ar atmosphere of 0.15 Pa by using a sputtering device in which the distance between the treatment target wafer and a target is set to 60 mm, thereby forming the Ti film of 20 nm in film thickness. This Ti film can be formed so as to be preferentially oriented to the (002) as described above.

After the Ti film is formed through the $NH_3$ plasma treatment, an RTA treatment is conducted at 650° C. for 60 seconds under $N_2$ gas atmosphere to nitride the Ti film to form TiN film (base electrical conductive film) 20 which is preferentially oriented to the (111) and serves to enhance the orientation of the film which is formed on the upper layer of the Ti film. Furthermore, oxidation preventing film 21 of a TiAlN film is formed on the base electrical conductive film 20. The TiAlN film is formed at a film thickness of 100 nm at a substrate temperature of 400° C. under pressure of 253.3 Pa by sputtering power of 1.0 kW under mixture gas atmosphere of Ar gas of 40 sccm and $N_2$ gas of 10 sccm by reactive sputtering using an alloyed target of Ti and Al, for example.

The state as shown in FIG. 6A is obtained through the above steps.

Figure 6B:
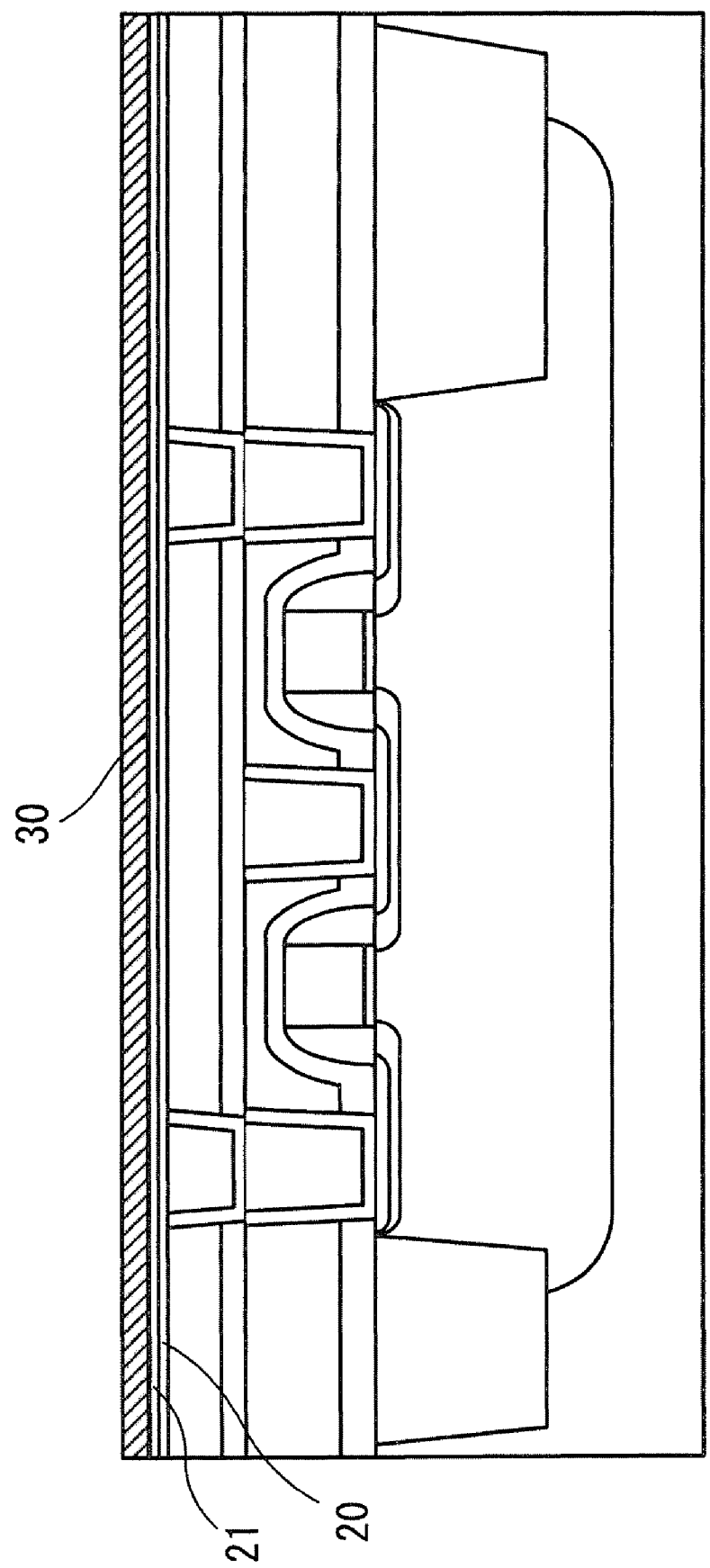

FIG. 6B is a schematic cross-sectional view of the main part of a metal film forming step for the lower electrode.

After the oxidation preventing film 21 has been formed, an Ir film 30 is formed on the oxidation preventing film 21 as the metal film constituting the lower layer portion of the lower electrode. The Ir film 30 is formed at a film thickness of 60 nm to 100 nm at a substrate temperature of 4500 under pressure of 0.2 Pa under Ar gas atmosphere by sputtering power of 0.3 kW, for example.

Furthermore, in order to enhance the orientation of the formed Ir film 30, the RTA treatment is conducted at 650° C. to 750° C. for 60 seconds under inert gas (for example, Ar gas) atmosphere, thereby obtaining the Ir film 30 in which a predetermined crystal face, for example, an Ir (111) is preferentially orientated. In place of the Ir film 30, a Ru film, a Rh film, a Pd film or the like may be used as the metal film.

Figure 6C:
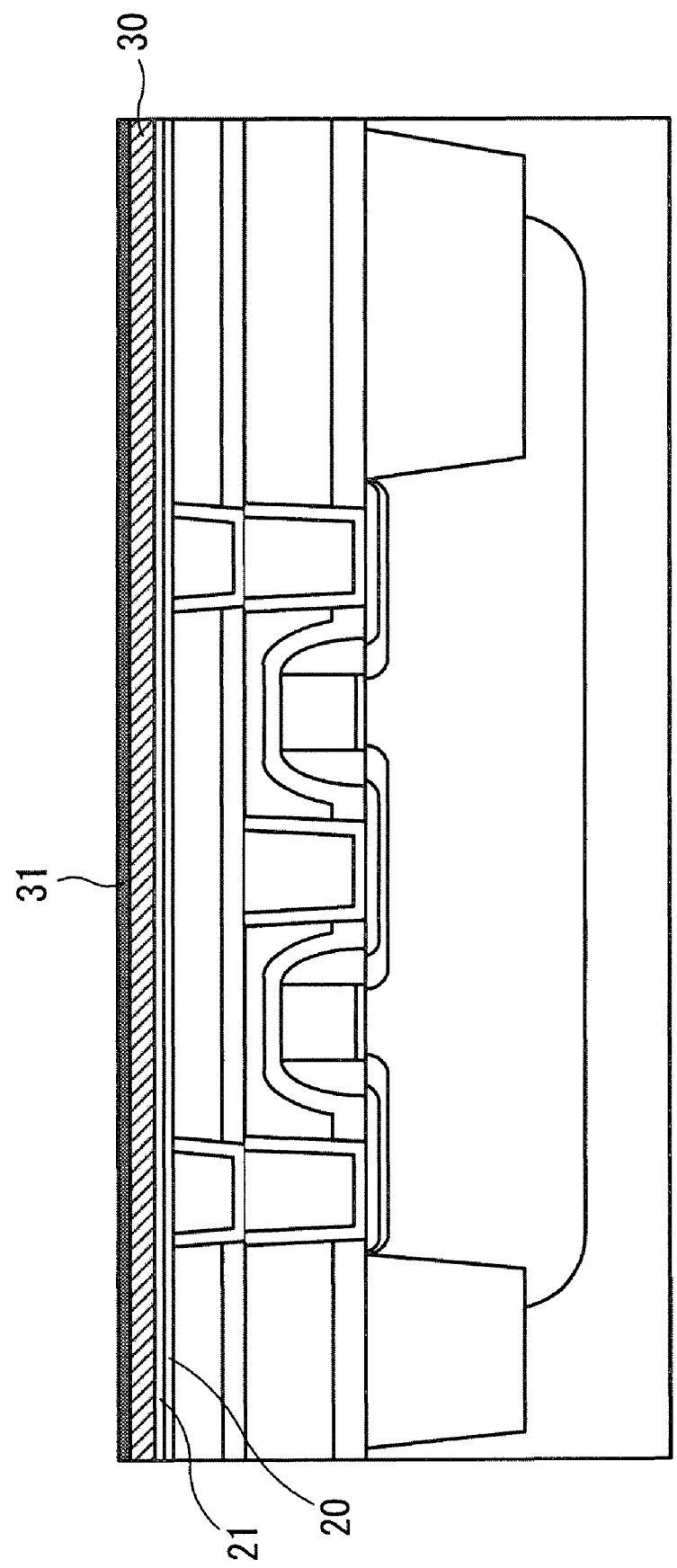

FIG. 6C is a schematic cross-sectional view showing the main part of a metal oxide film forming step for the lower electrode.

After the Ir film 30 is formed, an amorphous or microcrystal $IrO_X$ film 31 is formed on the Ir film 30. The $IrO_x$ film 31 is formed at a film thickness of 30 nm by the sputtering method under the condition: the mixture gas atmosphere of Ar gas of 186 sccm and $O_2$ gas of 14 sccm ($O_2$ gas rate of 7%), the film formation temperature of 60° C., the sputtering power of 0.5 kW, the film forming rate of 1.6 nm/second and the film forming time of 19 seconds, for example.

FIG. 6D is a schematic cross-sectional view of the main part of a ferroelectric film forming step.

After the $IrO_x$ film 31 is formed, a PZT film 32 is formed as a ferroelectric film. The PZT film 32 is first constructed by forming an initial layer and a core layer according to the MOCVD method and forming a surface layer portion according to the sputtering method. FIG. 6D shows the PZT film 32 as a single layer. The formation of the PZT film 32 according to the MOCVD method can be performed as follows.

Figure 7:
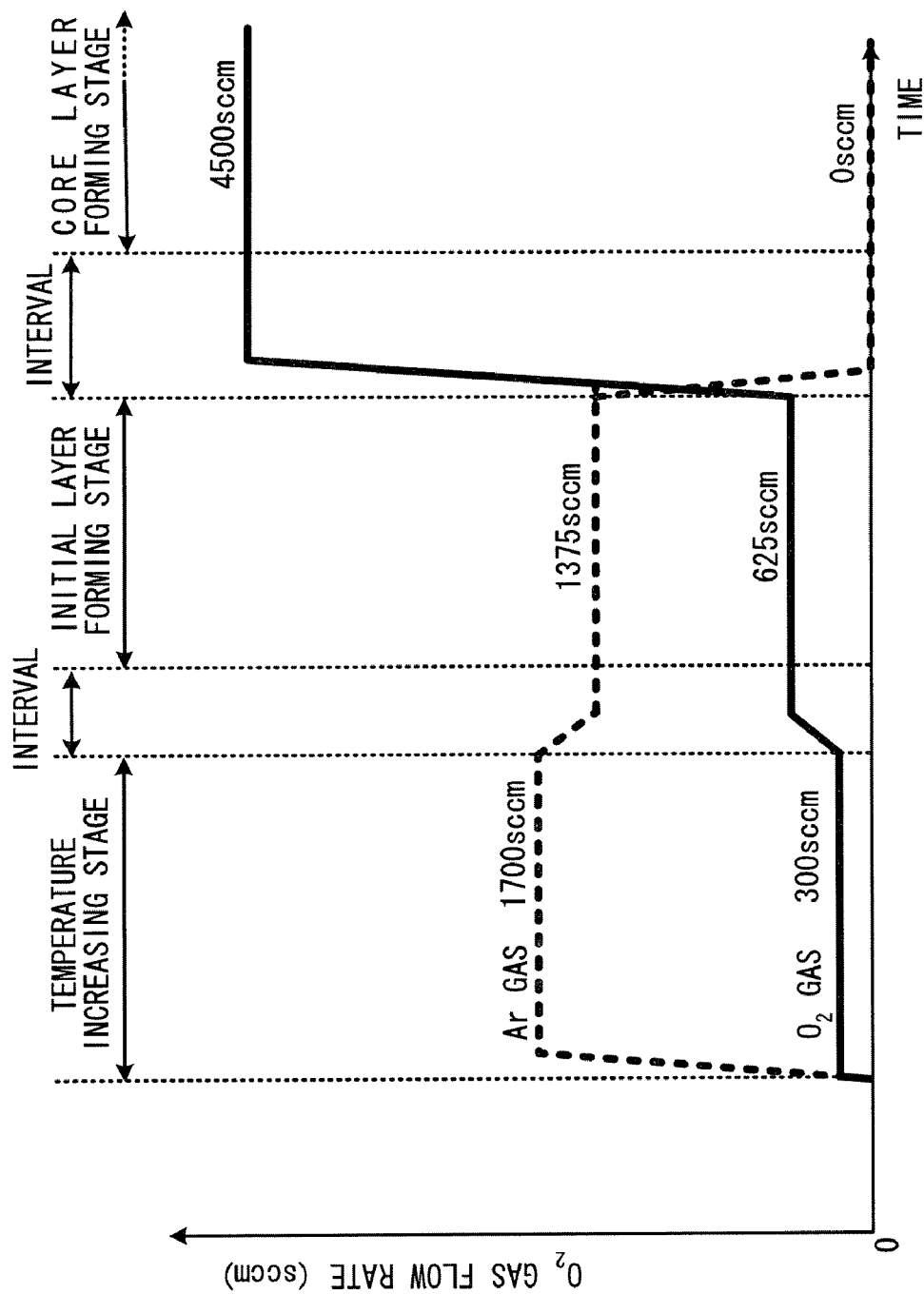
FIG. 7 is a diagram showing an example of a flow rate profile of atmosphere gas in the PZT film forming process of the first embodiment.

FIG. 7 is a diagram showing an example of a flow rate profile of atmosphere gas in the PZT film forming step.

First, a wafer in which the $IrO_x$ film 31 has been formed as shown in FIG. 6C is set in a chamber, and then Ar gas of 1700 sccm and $O_2$ gas ($O_2$ gas rate of 15%) of 300 sccm are made to flow through the chamber as shown in FIG. 7. Under this atmosphere, the temperature of the water is increased to a target temperature (the formation temperature of the PZT film 32 (the initial layer and the core layer)). At this temperature increasing stage, the amorphous or microcrystal $IrO_x$ film 31 is uniformly oxidized (crystallized). Non-uniformity of the surface of the lower electrode which is observed when the temperature is increased under 100% inert gas atmosphere or when the temperature is increased under 100% $O_2$ gas atmosphere is suppressed.

The details of the $O_2$ gas rate at the temperature increasing stage as described above will be described later.

When the temperature reaches the target temperature, an interval is provided until the raw material gas of the PZT film 32 is introduced (until the initial layer is formed), and the flow rates of Ar gas and $O_2$ gas are switched to the flow rate condition for forming the initial layer of the PZT film 32 during this period. In this case, the flow rate of Ar gas is set to 1375 sccm, and the flow rate of $O_2$ gas is set to 625 sccm. The $O_2$ gas rate in the mixture gas atmosphere at the initial layer forming stage is set so that the $O_2$ amount in the chamber is set to 0.33 time of the $O_2$ amount required to react with the organic metal raw material component. After the switching to the flow rate condition is carried out as described above, the raw material gas is introduced, and the formation of the initial layer of the PZT film 32 is started.

After the temperature is increased under the mixture gas atmosphere of Ar gas and $O_2$ gas (after the temperature reaches the target temperature), the treatment may be conducted under 100% $O_2$ gas atmosphere with keeping the target temperature before the interval for switching to the flow rate condition for forming the initial layer. After the temperature reaches the target temperature, the $IrO_x$ film 31 has already been crystallized and thus the crystal structure of the $IrO_x$ film 31 is not greatly varied even when the treatment is conducted under the 100% $O_2$ gas atmosphere as described above.

The raw material gas introduced after the interval is adjusted in advance as follows. That is, first, a bisdipybaroil metanato zinc ($Pb(DPM)_2$) is used as a Pb raw material, a tetrakisdimethylheptanedionate zirconium ($Zr(DMHD)_4$) is used as a Zr raw material, and a bisisopropoxy bisdipybaroil metanato Titan ($Ti(O-iPr)_2(DPM)_2$) is used as a Ti raw material, and each of these materials are dissolved in THF solvent at the concentration of 0.3 mol/L to prepare respective liquid raw materials of Pb, Zr, Ti. Subsequently, these liquid raw materials are respectively supplied into a vaporizer of an MOCVD device at the flow rates of 0.326 mL/minute, 0.200 mL/minute and 0.200 mL/minute respectively together with THF solvent of 0.474 mL/minute in flow rate, and vaporized, whereby the respective raw material gas of Pb, Zr, Ti are prepared.

The thus-prepared raw material gas is introduced into the chamber whose flow rate condition is changed to the flow rate condition for forming the initial layer, and the initial layer of 3 nm to 12 nm in film thickness is formed.

At this initial layer forming stage, the $IrO_x$ film 31 which is uniformly oxidized at the previous temperature increasing stage is uniformly reduced by the solvent component in the introduced raw material gas, whereby the Ir film 31a is formed as shown in FIG. 6D.

Furthermore, at this initial layer forming stage, the raw material gas is introduced under the state that the $O_2$ amount runs shorter as compared with the $O_2$ amount required to react with the organic metal raw material component (0.33 times), so that the organic metal raw material component in the raw material gas reacts with not only $O_2$ gas in the chamber, but also O of the $IrO_x$ film 31 to be decomposed and oxidized. Accordingly, the Ir film 31a which is perfectly reduced is formed simultaneously with the initial layer.

The Ir film 31a formed by reducing the $IrO_x$ film 31 can be formed so that the Ir (111) is preferentially oriented by controlling the orientation of the Ir film 30 of the lower layer portion. Accordingly, the initial layer in which the PZT (111) is preferentially oriented can be formed on the Ir film 31a.

In this case, the initial layer is formed at a film thickness of 3 nm to 12 nm. However, when the initial layer having a film thickness less than 3 nm is formed, the film forming time is shortened and thus the perfectly-reduced Ir film 31a is hardly formed. Accordingly, the orientation of the initial layer formed on the Ir film 31 is apt to be worse. Furthermore, when the initial layer having a film thickness exceeding 12 nm is formed, the switching charge amount of the finally-obtained ferroelectric capacitor is apt to be low.

After the initial layer is formed, the introduction of the raw material gas is temporarily stopped, and the flow rates of Ar gas and $O_2$ gas are switched to the flow rate condition for forming the core layer during the interval as shown in FIG. 7. In this case, the flow rate of Ar gas is switched to 0 sccm, and the flow rate of $O_2$ gas is switched to 4500 sccm. The $O_2$ gas rate in the mixture gas atmosphere at the core layer forming stage is set so that the $O_2$ amount in the chamber is equal to 6.77 times of the $O_2$ amount required to react with the organic metal raw material component. After switching to the flow rate condition as described above, the raw material gas is introduced, and the formation of the core layer is started.

At the core layer forming stage, the raw material gas is introduced under the state that the $O_2$ amount is excessive (6.77 times), so that the core layer having little oxygen deficiency is formed. Furthermore, the core layer is formed on the initial layer which is preferentially oriented to the PZT (111), so that it is likewise formed so as to be preferentially oriented to the PZT (111).

In the process of forming the initial layer and the core layer of the PZT film 32 by the MOCVD method as described above, the pressure in the chamber is set to 665 Pa, the substrate temperature is kept to 620° C., and the raw material gas is introduced for 620 seconds total, whereby the initial layer and the core layer of 100 nm total thickness are formed.

When the initial layer and the core layer are formed as described above, it is preferable that the initial layer forming rate (film forming rate) is set to a low value and the film forming rate of the core layer is set to a higher value than the initial layer forming rate. For example, the film forming rate of the initial layer is set to 0.1 nm/second or less, preferably to 0.05 nm/second or less, and more preferably to 0.04 nm/second. Furthermore, the film forming rate of the core layer is set to 0.17 nm/second. When the film forming rate of the initial layer exceeds 0.1 nm/second, the morphology of the core layer formed on the initial core is deteriorated, and the switching charge capacity of the finally-obtained ferroelectric capacitor is apt to be low. The switching charge amount of the ferroelectric capacitor when the initial layer is formed at the film forming rate of 0.1 nm/second or less is equal to 40 $\mu C/cm^2$, however, the switching charge amount of the ferroelectric capacitor when the initial layer is formed at the same film forming rate of 0.17 nm/second as the core layer is lower (32 $\mu C/cm^2$).

After the initial layer and the core layer are formed by the MOCVD method, the amorphous PZT film of 1 nm to 30 nm in film thickness is formed on the whole surface by the sputtering method, for example, thereby obtaining the PZT film 32 having the stack structure of the initial layer, the core layer and the amorphous PZT film. The amorphous PZT film of the surface layer portion is formed to enhance the flatness of the surface of the PZT film 32.

FIG. 6E is a schematic cross-sectional view of the main part of an upper electrode forming step.

After the PZT film 32 is formed, the upper electrode 33 is formed on the PZT film 32. The upper electrode 33 can be formed as follows, for example.

First, an $IrO_x$ film of 25 nm in film thickness which is crystalline at the formation time is formed on the PZT film 32 by the sputtering method. For example, the $IrO_x$ film as described above is formed at the formation temperature of 300° C. under the mixture gas atmosphere of Ar gas of 140 sccm and $O_2$ gas of 60 sccm by sputtering power of about 1 kW to 2 kW, for example.

Subsequently, a heat treatment is conducted at 725° C. for 60 seconds under the mixture gas atmosphere of Ar gas of 2000 sccm and $O_2$ gas of 20 sccm according to the RTA method. This heat treatment is conducted to perfectly crystallize the PZT film 32 to compensate the oxygen deficiency in the PZT film 32 and also recover the plasma damage in the process of forming the $IrO_x$ film for the upper electrode.

Subsequently, an $IrO_Y$ film of 50 nm to 150 nm in film thickness is formed. For example, when the $IrO_Y$ film is deposited under pressure of 0.8 Pa in Ar gas atmosphere for 45 seconds by sputtering power of 1.0 kW, the $IrO_Y$ film of 125 nm in film thickness can be formed. This $IrO_Y$ film is preferably formed at a film formation temperature of 100° C. or less in order to suppress abnormal growth thereof. Furthermore, in order to suppress catalysis action on hydrogen, avoid the PZT film 32 from being reduced by hydrogen radicals and enhance resistance to hydrogen of the ferroelectric capacitor, it is preferable that the $IrO_Y$ film is formed so as to have a composition near to the stoichiometric composition of $IrO_2$.

Subsequently, an Ir film is formed on the $IrO_Y$ film as a hydrogen barrier film and electrical conductivity enhancing film by the sputtering method. For example, the Ir film is formed at a film thickness of 50 nm to 100 nm under pressure of 1 Pa in Ar gas atmosphere by sputtering power of 1.0 kW.

As described above, the upper electrode 33 having the stack structure of $Ir/IrO_Y/IrO_X$ is formed.

When the upper electrode 33 is formed, an Ir film, a Ru film, a Rh film, a rhenium (Re) film, an osmium (Os) film or a Pd film, an oxide film thereof, an electrical conductive oxide film such as a SRO film or the like, or a stack structure of these elements may be used in place of the $IrO_X$ film or the $IrO_Y$ film. Furthermore, in place of the Ir film, a Ru film, a Rh film, a Pd film or the like may be used as the uppermost layer of the upper electrode 33.

Figure 6F:
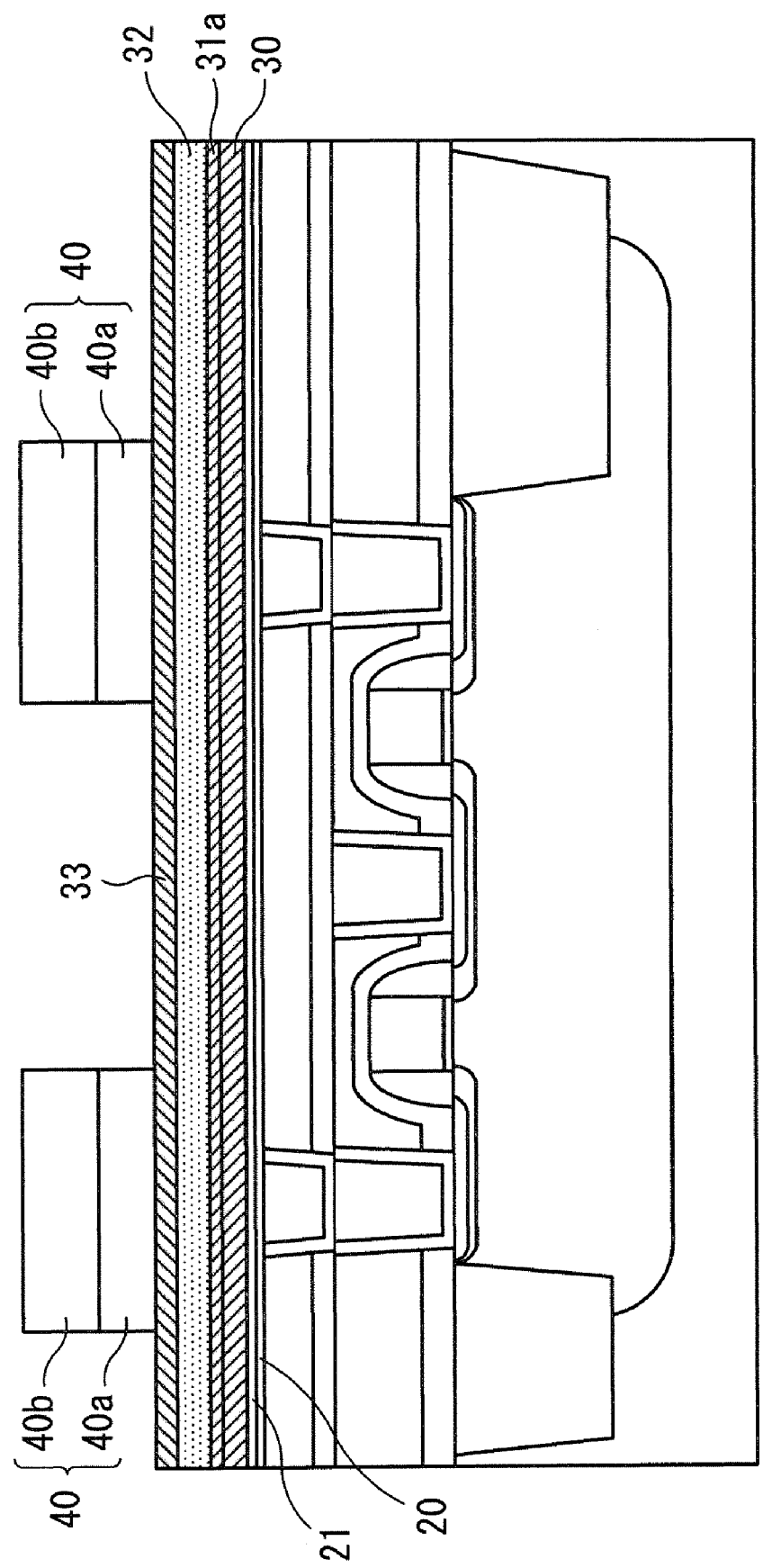
Figure 6G:
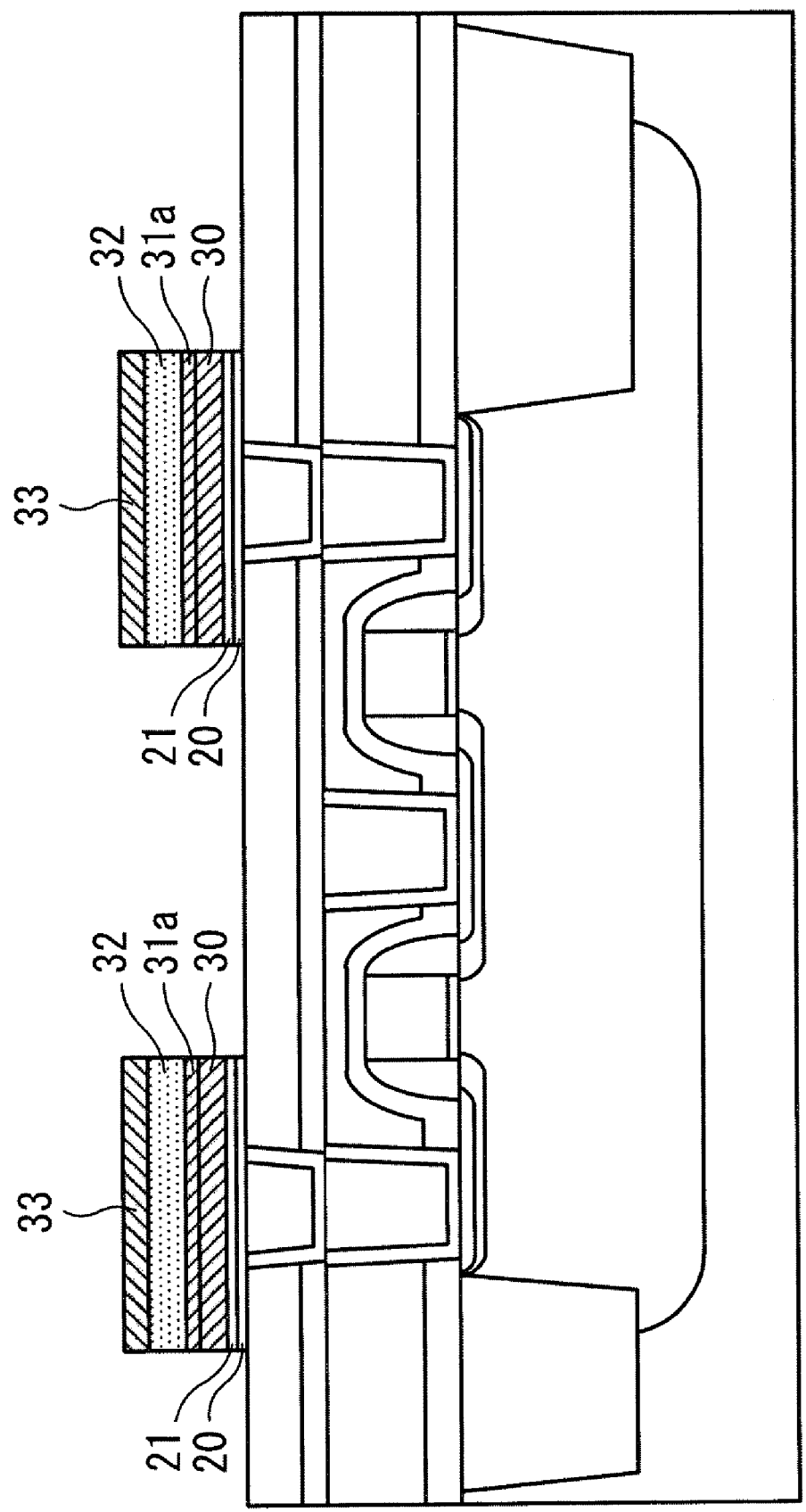

FIG. 6F is a schematic cross-sectional view of the main part of a hard mask forming step for ferroelectric capacitor patterning, and FIG. 6G is a schematic cross-sectional view of the main part of a ferroelectric capacitor patterning step.

After the upper electrode 33 is formed, the back surface of the wafer is washed, and then a hardmask 40 comprising first and second mask layers 40a and 40b is formed for the patterning of the ferroelectric capacitor. This hard mask 40 is formed as follows, for example.

First, a TiN film or a TiAlN film is formed as the first mask layer 40a on the whole surface by the sputtering method, and a SiO film is formed as the second mask layer 40b on the first mask layer 40a by the CVD method using TEOS gas. Subsequently, the second mask layer 40b is patterned in an island-shape. After the patterning, the first mask layer 40a is etched by using the second mask layer 40b as a mask, whereby the hard mask 40 comprising the first and second mask layers 40a and 40b as shown in FIG. 6F is formed.

After the hard mask 40 is formed as described above, the upper electrode 33, the PZT film 32, the Ir film 31a, 30 at portions which are not covered by the hardmask 40 are subjected to patterning by plasma etching using mixture gas of hydrogen bromide (HBr), $O_2$ gas, Ar gas and octafluorobutane ($C_4F_8$) as etching gas.

Subsequently, after the second mask layer 40b is selectively removed by dry etching or wet etching, dry etching is carried out under the state that the first mask layer 40a is left, whereby the oxidation preventing film 21 and the base electrical conductive film 20 are removed and the first mask layer 40a is removed. Accordingly, the ferroelectric capacitor structure as shown in FIG. 6G is obtained.

FIG. 6H is a schematic cross-sectional view of the main part of a protection film forming step.

After the ferroelectric capacitor is formed, first ALO film 41 is formed as the protection film so as to cover the ferroelectric capacitor. The first ALO film 41 is formed at a film thickness of 20 nm by the sputtering method, for example. Or, the first ALO film 41 of 2 nm to 5 nm in film thickness is formed by the MOCVD method.

After the first ALO film 41 is formed, a recovery annealing is conducted to recover the damage of the PZT film 32 applied through the above steps. This recovery annealing is executed for 60 minutes under $O_2$ gas contained atmosphere while the wafer temperature in the furnace is set to 550° to 700° C., preferably to 600° C.

Figure 6I:
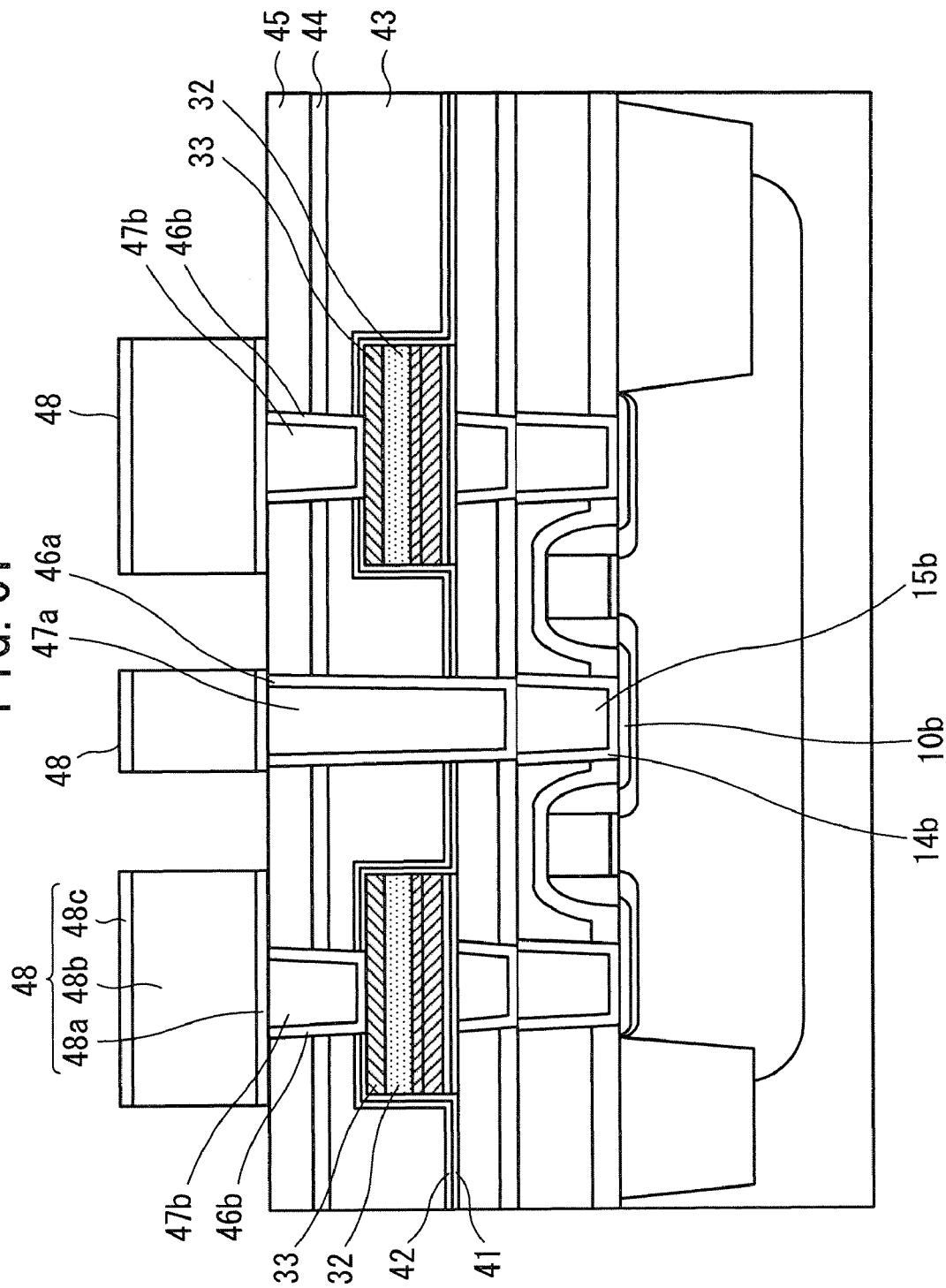

FIG. 6I is a schematic cross-sectional view of the main part after the wire layer has been formed.

After the formation of the first ALO film 41 and the recovering annealing, second ALO film 42 of 38 nm in film thickness is formed on the first ALO film 41 by the CVD method, for example.

Subsequently, third interlayer insulating film 43 formed of a SiO film of 1500 nm in film thickness is formed on the whole surface by the plasma CVD method using mixture gas containing TEOS gas, $O_2$ gas and helium (He) gas. Inorganic film having insulating property or the like may be formed as the third interlayer insulating film 43. After the third interlayer insulating film 43 is formed, the third interlayer insulating film 43 is flattened by the CMP method.

Thereafter, a heat treatment is conducted under a plasma atmosphere which is generated by using dinitrogen monoxide gas ($N_2O$), $N_2$ gas or the like. As a result of this heat treatment, the water component in the third interlayer insulating film 43 is removed, and the film quality of the third interlayer insulating film 43 is varied, so that the water component hardly intrudes into the third interlayer insulating film 43.

Subsequently, barrier film 44 formed of a ALO film of 20 nm to 100 nm in film thickness is formed on the whole surface by the sputtering method or the CVD method, for example. This barrier film 44 is flatly formed because it is formed on the flattened third interlayer insulating film 43.

Subsequently, a fourth interlayer insulating film 45 formed of a SiO film of 300 nm to 500 nm in film thickness is formed on the whole surface by the plasma CVD method using TEOS gas, for example. A SiON film, a SiN film or the like may be formed as the fourth interlayer insulating film 45. After the fourth interlayer insulating film 45 is formed, it is flattened by the CMP method.

Subsequently, a contact hole extending to the W plug 15b connected to the second source-drain region 10b is formed, a W plug 47a is formed through a glue film 46a. Thereafter, a contact hole extending to the upper electrode 33 of the ferroelectric capacitor is formed. After the formation of this contact hole, a heat treatment of 550° C. under $O_2$ gas atmosphere is conducted, and oxygen deficiency occurring in the PZT film 32 in connection with the formation of the contact hole is cured. After the heat treatment, a W plug 47b is formed through the glue film 46b in the contact hole.

The glue film 46a, 46b is preferably formed of a monolayer of a TiN film, however, it may be formed to have a stack structure which comprises a Ti film formed by the sputtering method and a TiN film formed on the Ti film by the MOCVD method. When the glue film 46a, 46b is formed of the TiN film or by using the TiN film, it is preferable that the plasma treatment using $N_2$ gas and hydrogen ($H_2$) gas is conducted to remove C from the TiN film. The Ir film is formed as hydrogen barrier film on the upper electrode 33 as described above, and thus the $IrO_x$ film, etc. as the lower layer of the Ir film is not reduced by the plasma treatment.

After the glue film 46a, 46b and the W plugs 47a, 47b are formed as described above, wires 48 are formed on the W plugs 47a, 47b. The wires 48 are formed by successively forming a TiN/Ti laminate film 48a comprising a Ti film of 60 nm in film thickness and a TiN film of 30 nm in film thickness, a AlCu alloy film 48b of 360 nm in film thickness and a TiN/Ti laminate film 48c comprising a Ti film of 5 nm in film thickness and a TiN film of 70 nm in film thickness, and then conducting patterning on them, thereby forming a wire layer of a first layer.

Subsequently, wire layers of second and subsequent layers are formed to complete the FeRAM.

Here, the $O_2$ gas rate at the temperature increasing stage in the process of forming the PZT film 32 by the MOCVD method when the FeRAM is formed through the above flow will be described in detail.

First, the relationship between the $O_2$ gas rate at the temperature increasing stage and the orientation of the PZT film when the Ir film of a monolayer is formed as the lower electrode and the initial layer and the core layer of the PZT film are formed on the Ir film by the MOCVD method will be described.

In this case, according to the above example (FIGS. 6A and 6B), a TiN film which was preferentially oriented to the (111) was formed as a base electrical conductive film, a TiAlN film was formed on the TiN film as an oxidation preventing film, and an Ir film of a monolayer was formed on the TiAlN film as the lower electrode, thereby forming the stack structure of Ir/TiAlN/TiN. Furthermore, according to the above example (FIGS. 6D and 7), the initial layer and the core layer of a PZT film were formed on the Ir/TiAlN/TiN stack structure by the MOCVD method. At this time, at the temperature increasing stage before the raw material gas was introduced, the temperature was increased under the mixture gas atmosphere of Ar gas and $O_2$ gas, and the $O_2$ gas rate was changed to 0%, 15%, 30% and 69%. The condition at the forming stage of the initial layer and the core layer was set to the same as the above example (FIGS. 6D and 7). The temperature was increased under each $O_2$ gas rate condition, and the crystal structure of the PZT film obtained after the raw material gas was introduced was investigated by using an X-ray diffraction apparatus. The result is shown in the following FIGS. 8 to 10.

In the following description, the center portion of the wafer means the center portion of the wafer in a plan view of the wafer. The lower portion, upper portion, left portion and right portion of the wafer means the lower portion, upper portion, left portion and right portion of the wafer with respect to the center portion of the wafer in a plan view of the wafer oriented in a predetermined direction. In this case, the lower portion, upper portion, left portion and the right portion of the wafer are set while the notch direction to the center portion of the wafer is set as the downward direction.

Figure 8:
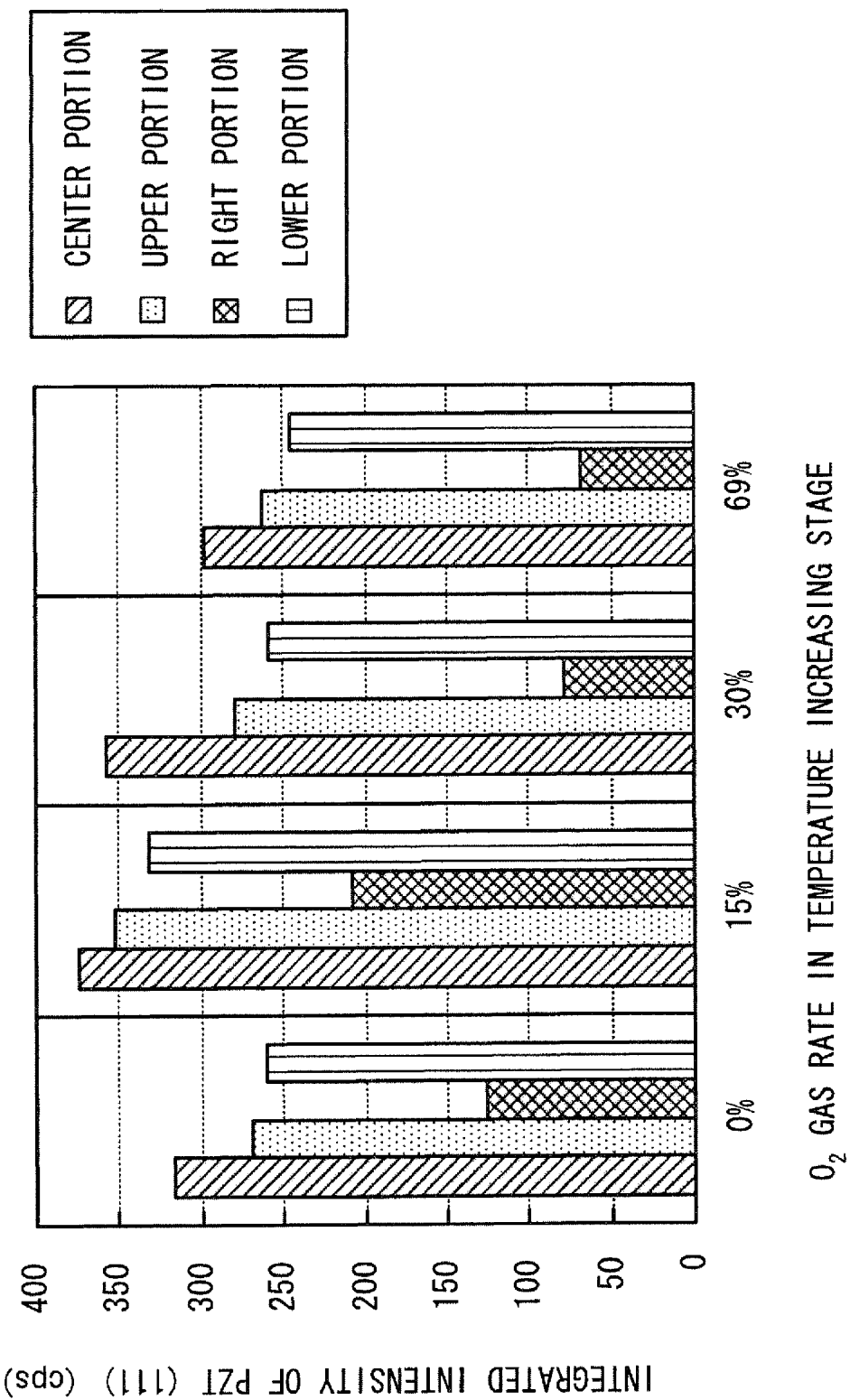
FIG. 8 is a graph showing the relationship between the $O_2$ gas rate at a temperature increasing stage and the integrated intensity of the PZT (111) in the first embodiment.
Figure 9:
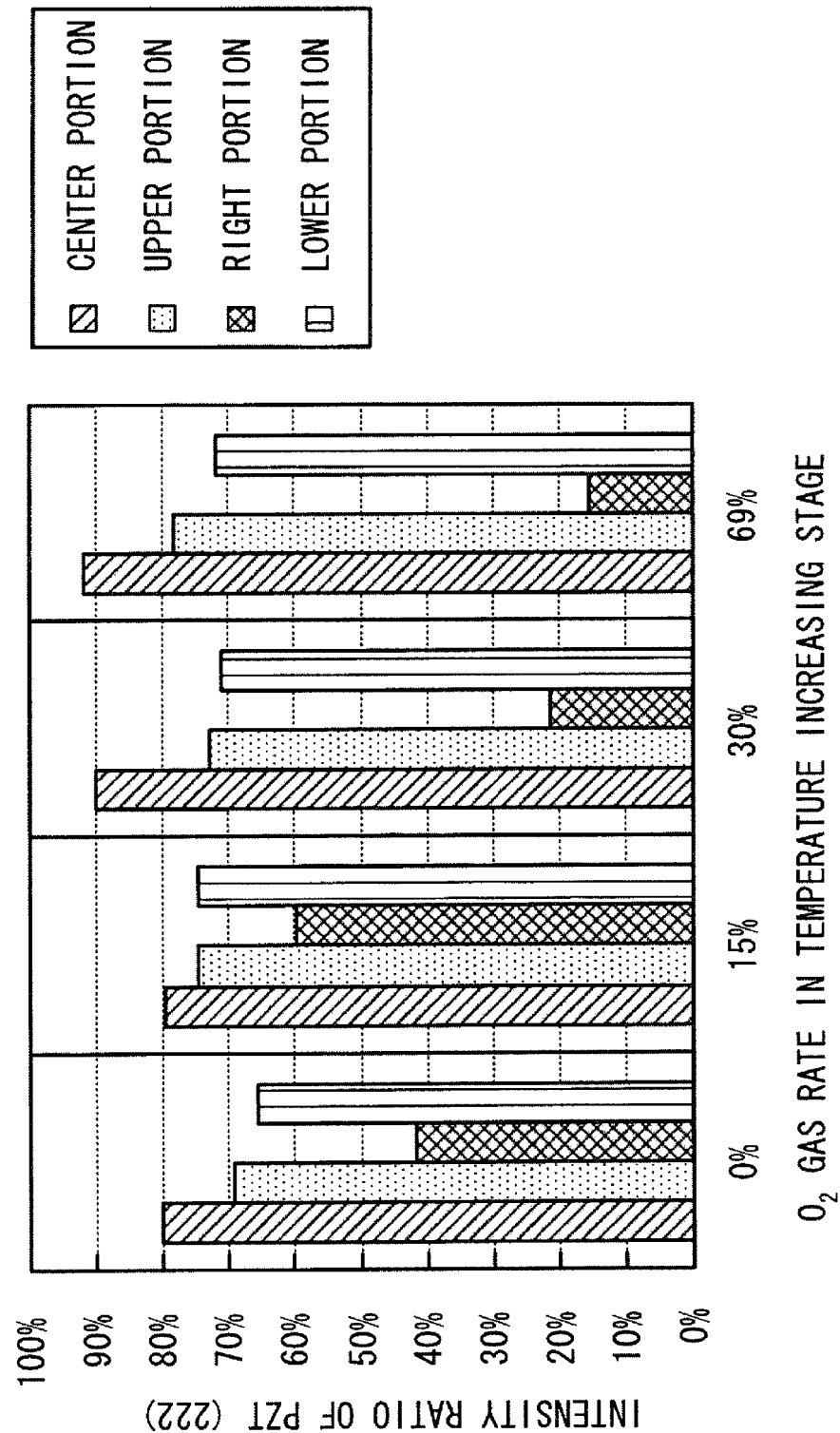
FIG. 9 is a graph showing the relationship between the $O_2$ gas rate at the temperature increasing stage and the intensity ratio of the PZT (222) in the first embodiment.
Figure 10:
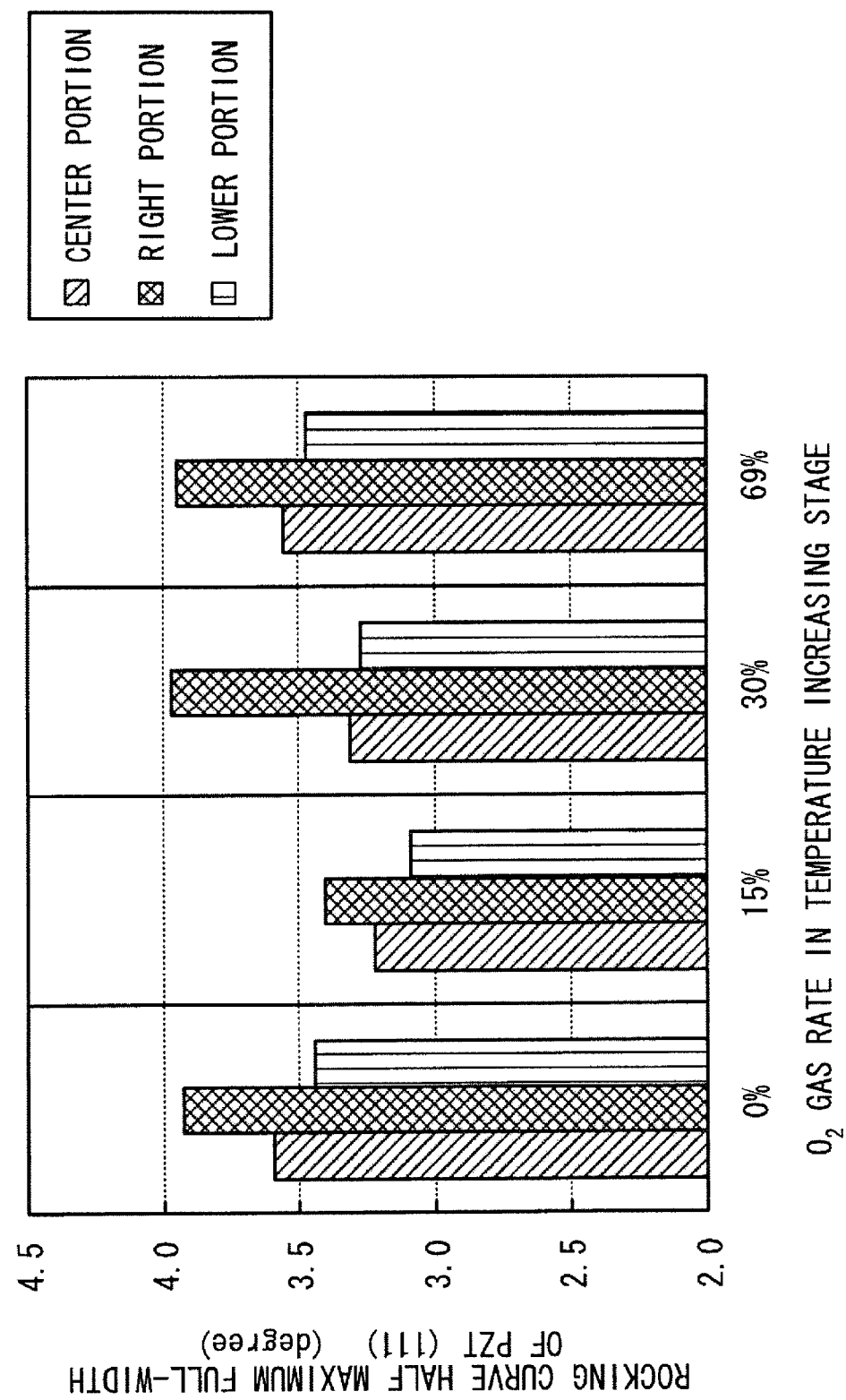
FIG. 10 is a graph showing the relationship between the $O_2$ gas rate at the temperature increasing stage and a rocking curve half maximum full-width in the first embodiment.

FIG. 8 is a graph showing the relationship between the $O_2$ gas rate at the temperature increasing stage and the integrated intensity of the PZT (111), FIG. 9 is a graph showing the relationship between the $O_2$ gas rate at the temperature increasing stage and the intensity ratio of the PZT (222), and FIG. 10 is a graph showing the relationship between the $O_2$ gas rate at the temperature increasing stage and the rocking curve half maximum full-width (FWHM) of the PZT (111). The intensity ratio of the PZT (222) is calculated by determining the integrated intensities of the PZT (100) and the PZT (101) from the result of the X-ray diffraction measurement as in the case of the integrated intensity of the PZT (111) and performing the calculation based on the equation (1).

From FIGS. 8 and 9, even when the $O_2$ gas rate at the temperature increasing stage is set to any condition, the integrated intensity of the PZT (111) and the intensity ratio of the PZT (222) are reduced. Furthermore, from FIG. 10, the rocking curve half maximum full-width of the PZT (111) when the $O_2$ gas rate at the temperature increasing stage is equal to 15% is slightly better as compared with other $O_2$ gas rate conditions. The orientation property of the PZT (111) at the right portion of the wafer is worse irrespective of the $O_2$ gas rate at the temperature increasing stage. With respect to the Ir film at the right portion of the wafer, it is apparent that the oxidation at the temperature increasing stage and the reduction based on the solvent component after the raw material gas is introduced occur nonuniformly.

When the $O_2$ gas rate at the temperature increasing stage is set to 0%, the oxidation of the Ir film on the surface of the lower electrode does not occur at the temperature increasing stage, however, it is estimated that abnormal oxidation occurs because $O_2$ gas (Ar gas of 1375 sccm, $O_2$ gas of 625 sccm ($O_2$ gas rate of about 31%)) is introduced from the stage just before the initial layer is formed (interval) as shown in FIG. 7 and thus the Ir film is suddenly exposed to the $O_2$ gas contained atmosphere, so that abnormal oxidation occurs and the surface after the abnormal oxidation as described above is nonuniformly reduced by the solvent component in the raw material gas.

Furthermore, when the $O_2$ gas rate at the temperature increasing stage is set to 30% or more, it is estimated that the abnormal oxidation of the Ir film of the surface of the lower electrode is liable to occur at the temperature increasing time, and the surface as described above is nonuniformly reduced by the solvent component in the raw material gas. When the $O_2$ gas rate at the temperature increasing stage is set to 15%, it is estimated that such abnormal oxidation is suppressed to some extent at the temperature increasing time.

Subsequently, in order to more enhance the orientation of the PZT (111) as compared with the result shown in FIGS. 8 to 10, the same investigation was carried out while the structure of the lower electrode was changed. The lower electrode was obtained by forming an amorphous or microcrystal $IrO_x$ film on the Ir/TiAlN/TiN stack structure to obtain the $IrO_x$/Ir/TiAlN/TiN laminate structure according to the above example (FIGS. 6A and 6B). According to the example (FIGS. 6D and 7), the initial layer and the core layer of the PZT film were formed on the lower electrode by the MOCVD method. At this time, at the temperature increasing stage before the raw material gas was introduced, the temperature was increased under the mixture gas atmosphere of Ar gas and $O_2$ gas, and the $O_2$ gas rate was changed to 0%, 7.5%, 15%, 22.5%, 30%, 69%. The temperature was increased under each $O_2$ gas rate condition, and the crystal structure of the PZT film obtained after the raw material gas was introduced was investigated by using the X-ray diffraction apparatus. The results are shown in FIGS. 11 to 14.

Figure 11:
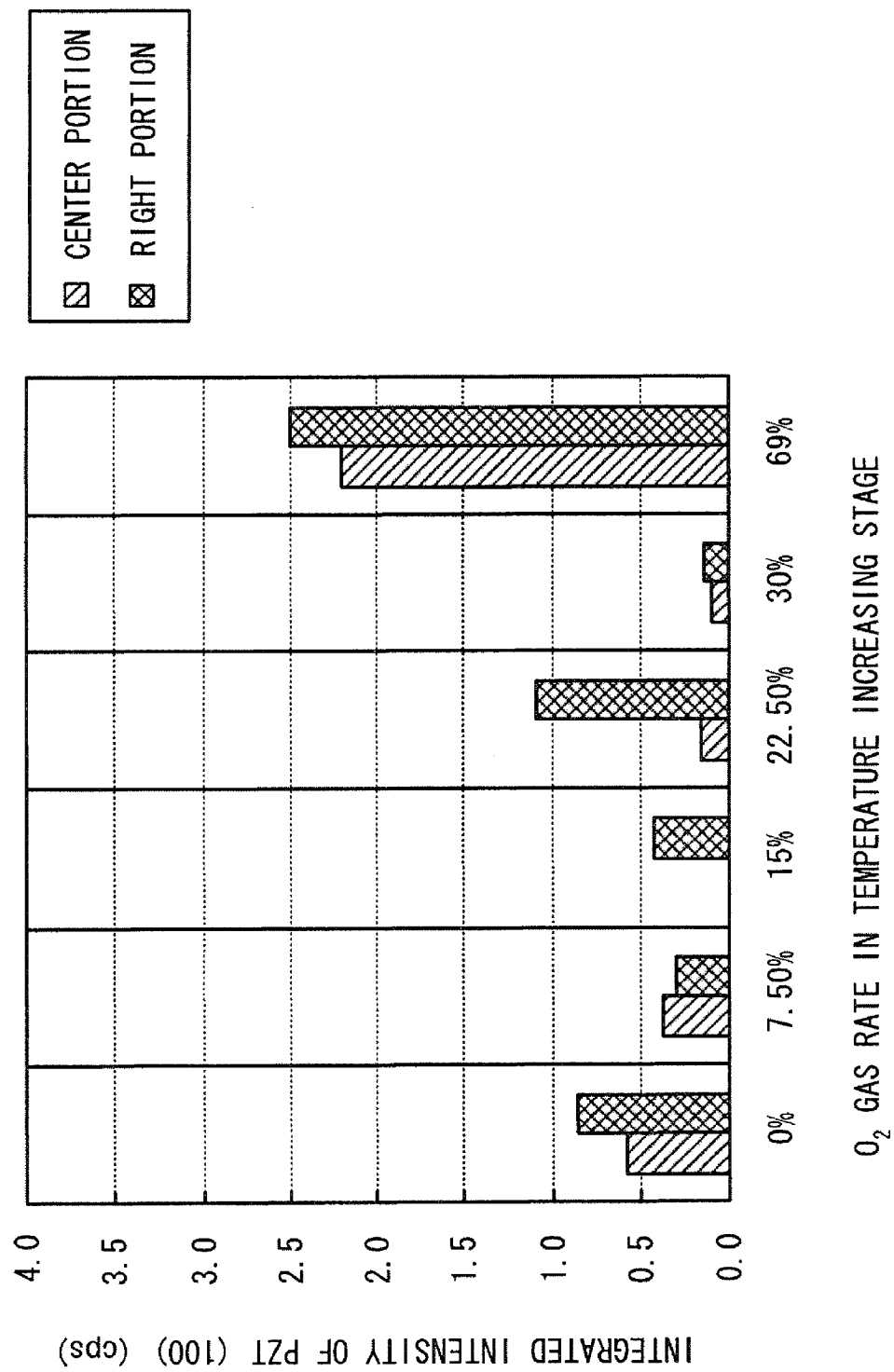
FIG. 11 is a graph showing the relationship between the gas rate at the temperature increasing stage and the integrated intensity of the PZT (100) in the first embodiment.
Figure 12:
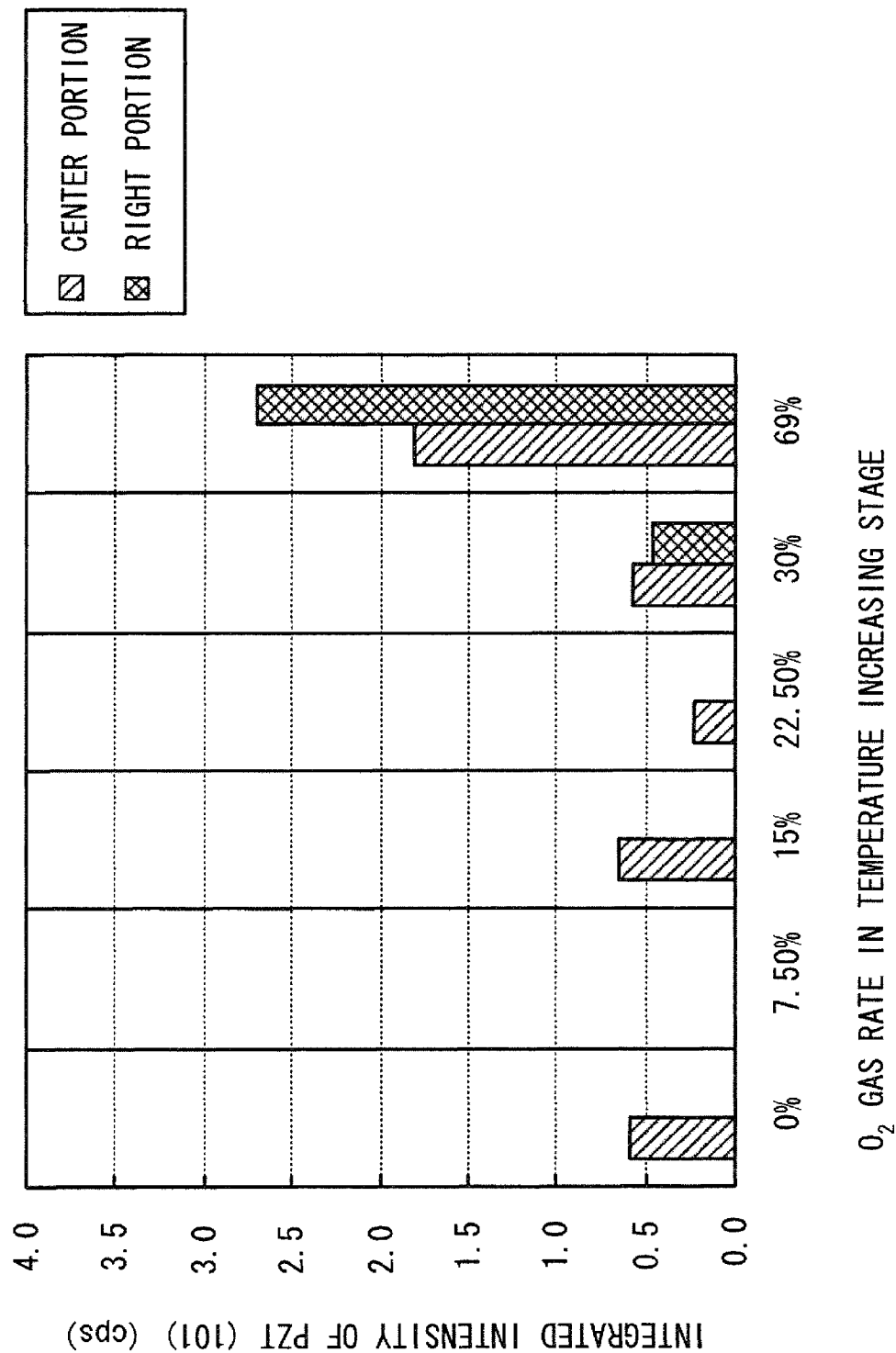
FIG. 12 is a graph showing the relationship between the gas rate at the temperature increasing stage and the integrated intensity of the PZT (101) in the first embodiment.
Figure 13:
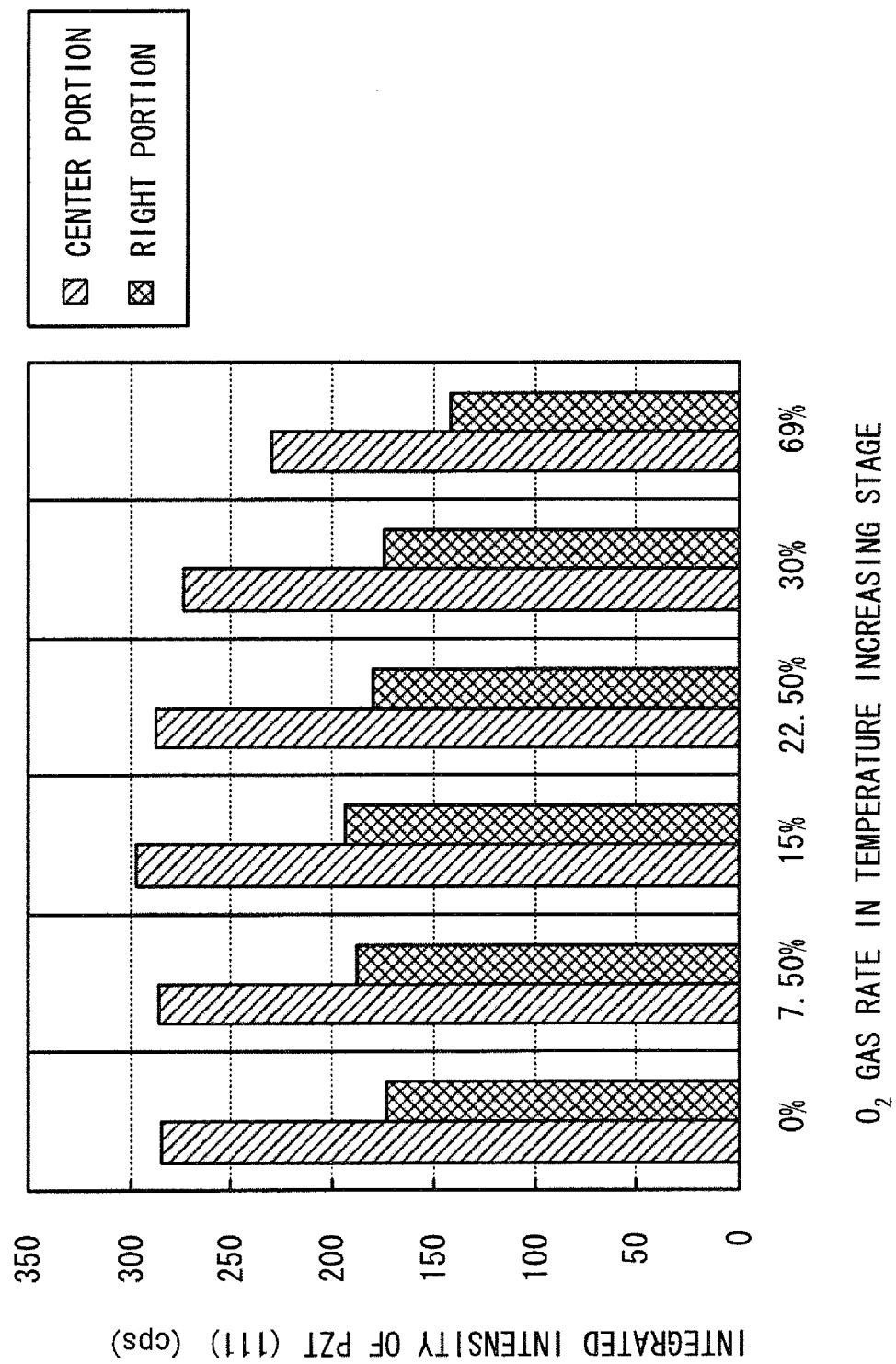
FIG. 13 is a graph showing the $O_2$ gas rate at the temperature increasing stage and the integrated intensity of the PZT (111) in the first embodiment.
Figure 14:
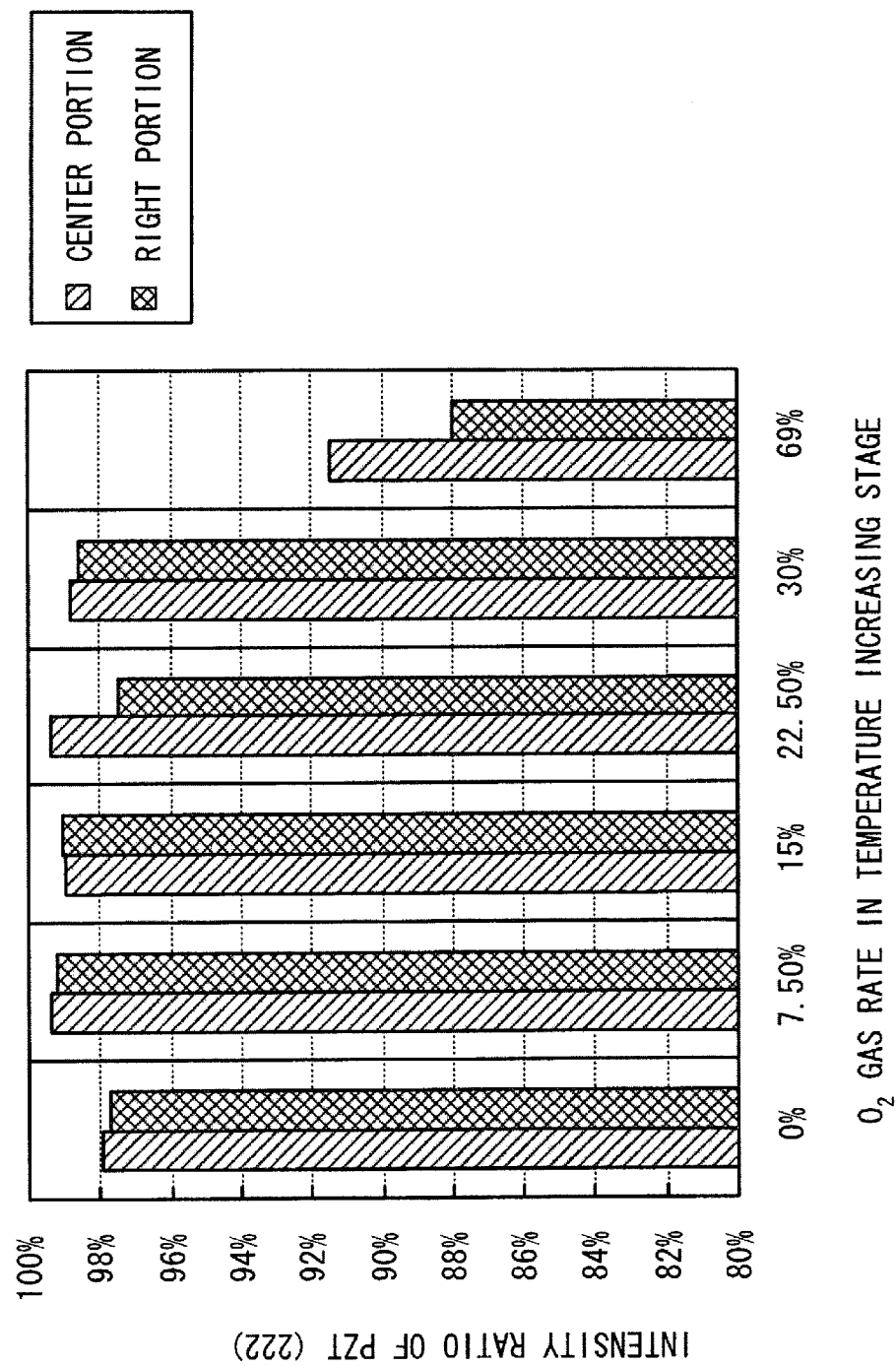
FIG. 14 is a graph showing the relationship between the gas rate at the temperature increasing stage and the intensity ratio of the PZT (222) in the first embodiment.

FIG. 11 is a graph showing the relationship between the $O_2$ gas rate at the temperature increasing stage and the integrated intensity of the PZT (100), FIG. 12 is a graph showing the relationship between the $O_2$ gas rate at the temperature increasing stage and the integrated intensity of the PZT (101), FIG. 13 is a graph showing the relationship between the $O_2$ gas rate at the temperature increasing stage and the integrated intensity of the PZT (111), and FIG. 14 is a graph showing the relationship between the $O_2$ gas rate at the temperature increasing stage and the intensity ratio of the PZT (222).

From FIGS. 11 to 14, when the $O_2$ gas rate at the temperature increasing stage is set to 30% or less, generation of the PZT (100) and the PZT (101) is suppressed, and the intensity ratio of the PZT (222) is increased. Conversely, when the $O_2$ gas rate at the temperature increasing stage is set to 69%, the intensity ratio of the PZT (222) is lowered. When the $O_2$ gas rate at the temperature increasing stage is set to 30% or less, a high intensity ratio can be obtained not only at the center portion of the wafer, but also at the right portion of the wafer.

When the $O_2$ gas rate at the temperature increasing stage is set to 30% or less, it is estimated that the $IrO_X$ film is oxidized (crystallized) at the temperature increasing stage. However, the abnormal oxidation thereof is suppressed, and the $IrO_X$ film is uniformly reduced to the Ir film by the solvent component in the raw material gas, so that the intensity ratio of the PZT (222) is increased.

On the other hand, when the $O_2$ gas rate at the temperature increasing stage is set to 69%, it is estimated that the $IrO_X$ film is crystallized at the temperature increasing time, abnormal oxidation of the surface thereof occurs simultaneously, and the $IrO_X$ film is not uniformly reduced by the solvent component in the raw material gas, so that the intensity ratio of the PZT (222) is lowered.

From these results, when the $IrO_X$/Ir/TiAlN/TiN stack structure is used and the PZT film is formed on the stack structure by the MOCVD method, the $O_2$ gas rate in the mixture gas atmosphere at the temperature increasing stage is set to 30% or less, preferably to 10% to 20% and more preferably to 15%.

Figure 15:
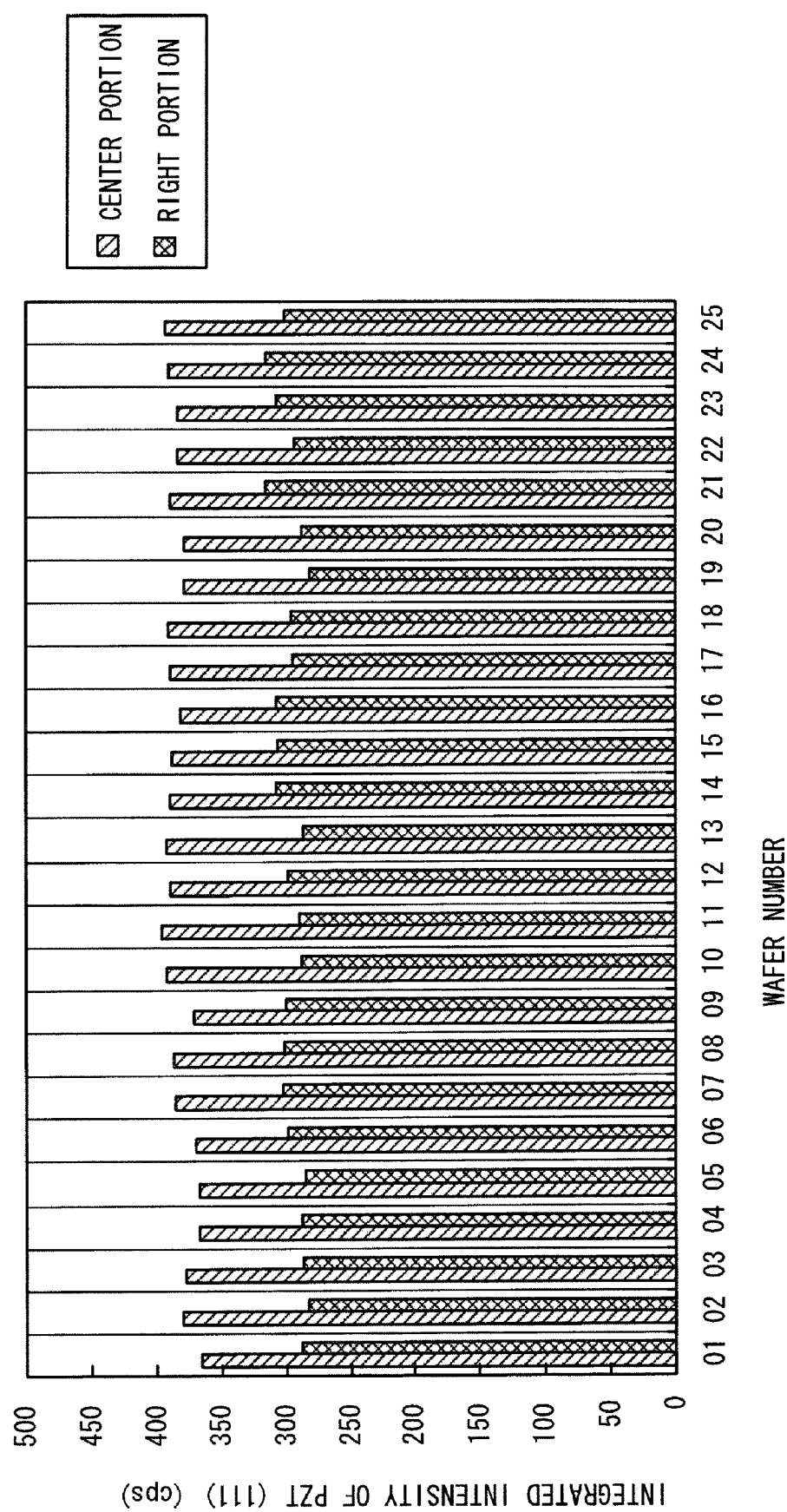
FIG. 15 is a graph showing the integrated intensities of the PZT (111) of plural wafers according to the first embodiment.
Figure 16:
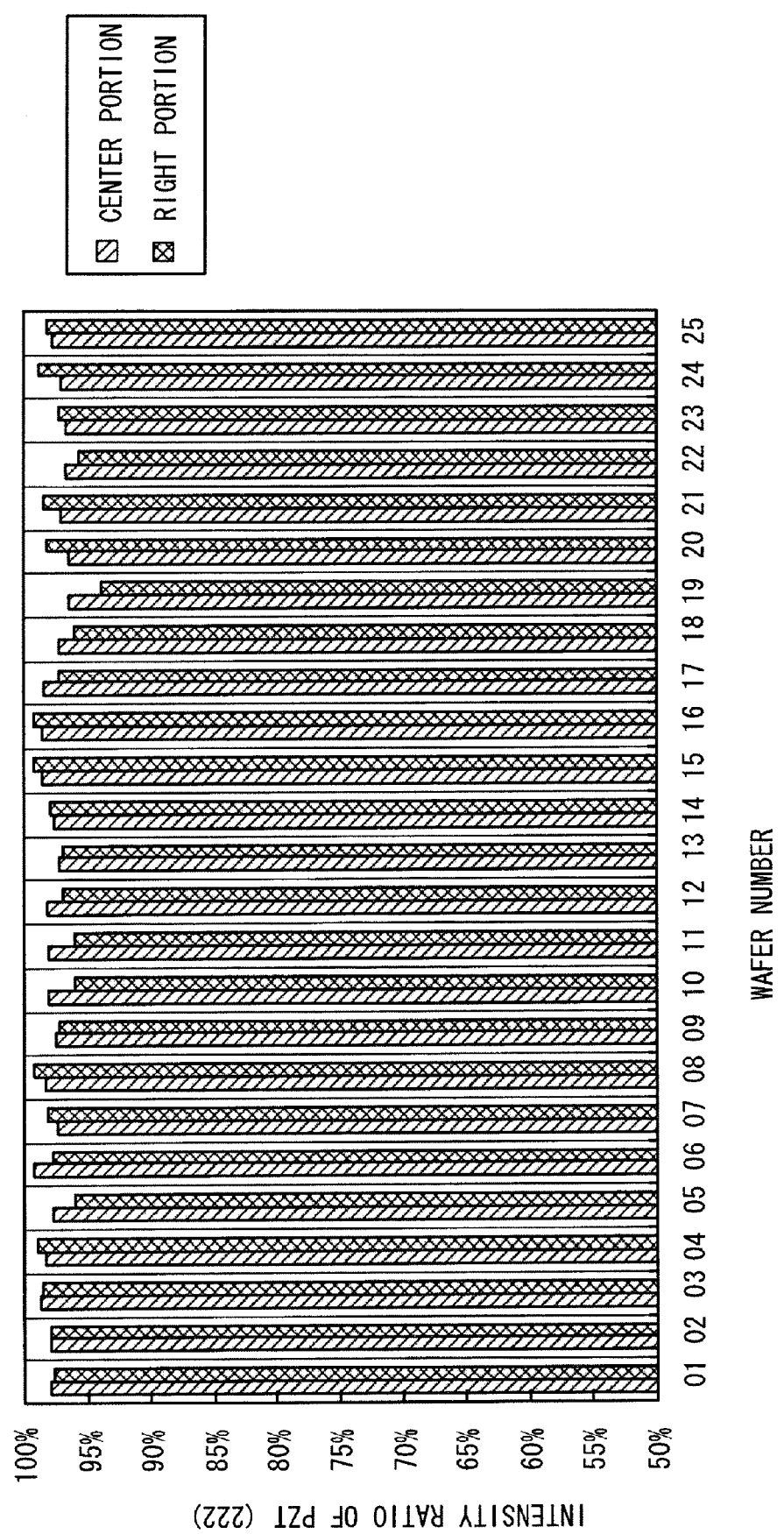
FIG. 16 is a graph showing the intensity ratios of the PZT (222) of plural wafers according to the first embodiment.

Furthermore, investigation results of the in-plane orientation distribution of the wafer and the inter-wafer dispersion are shown in FIGS. 15 and 16.

FIG. 15 is a graph showing the integrated intensities of the PZT (111) of plural wafers, and FIG. 16 is a graph showing the intensity ratios of the PZT (222) of the plural wafers.

In this case, the $IrO_X$/Ir/TiAlN/TiN stack structure was formed on twenty five wafers according to the example (FIGS. 6A to 7), the PZT film was formed on each stack structure by the MOCVD method. The crystal structure of the PZT film of each wafer was investigated by using the X-ray diffraction apparatus.

From FIG. 15, the dispersion of the integrated intensity of each PZT (111) at the center portion and the right portion of the wafer among the 25 wafers was very small, and excellent reproducibility was obtained even when the PZT film was continuously formed. From FIG. 16, the difference in the intensity ratio of each PZT (222) of the center portion and the right portion of the wafer was very small, the intensity ratios of all wafers were 94% or more, and the difference in the intensity ratio of the PZT (222) among the wafers was very small.

As described above, according to the FeRAM forming method of the first embodiment, the ferroelectric capacitor having excellent orientation and suppressed dispersion can be obtained, and high-performance and high-reliability FeRAM can be stably formed.

Next, a second embodiment will be described. In the description of the second embodiment, the same elements as described in the first embodiment are represented by the same reference numerals.

Figure 17A:
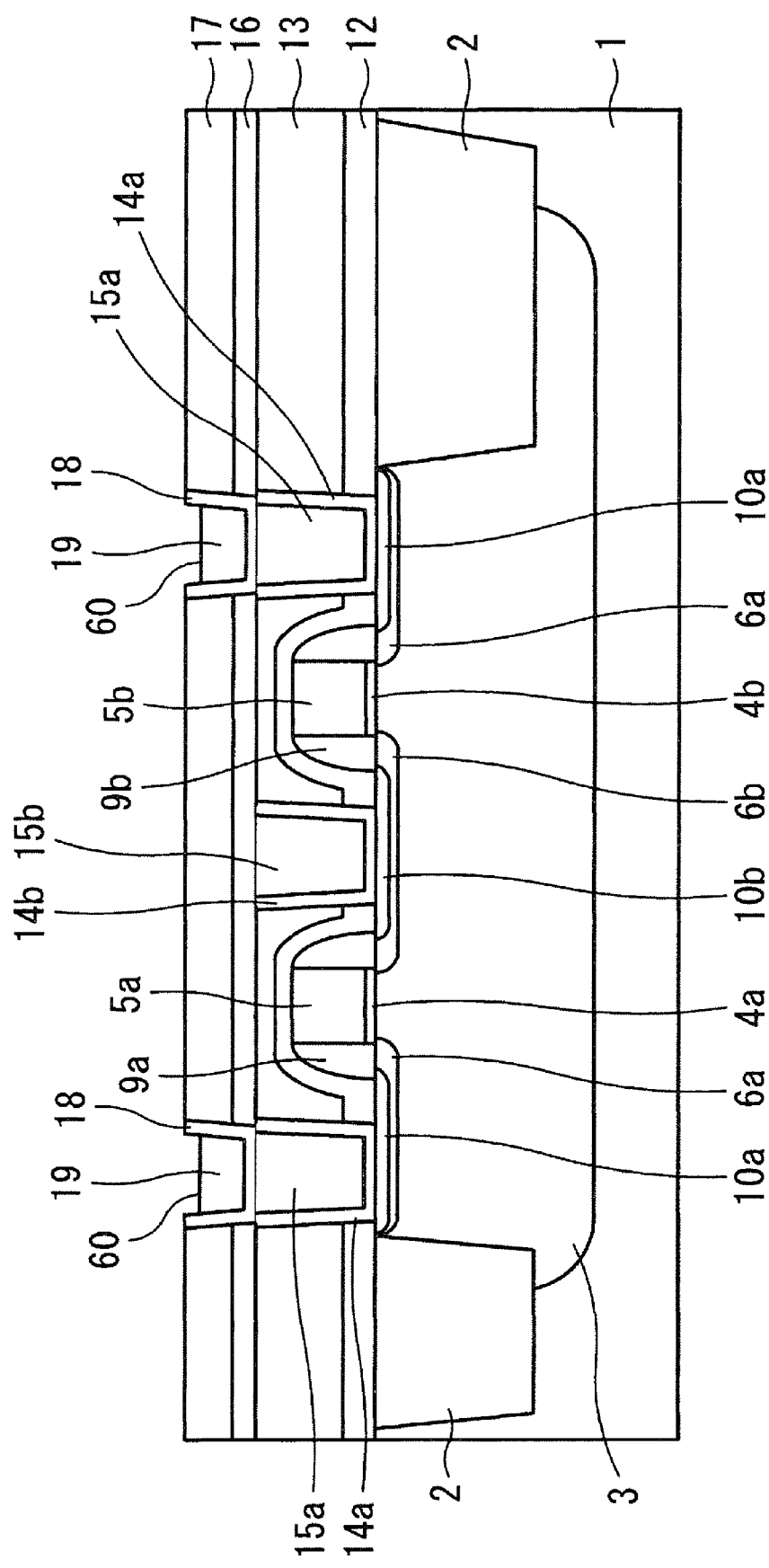
FIGS. 17A and 17B are diagrams showing a part of a manufacturing process of a semiconductor device according to a second embodiment.

FIG. 17A is a schematic cross-sectional view of the main part after the glue film and the W plugs of the second embodiment have been formed.

In the first embodiment, as shown in FIG. 6A, at the formation stage of the glue film 18 and the W plug 19, a contact hole is formed in the second interlayer insulating film 17, and then the Ti film, the TiN film and the W film are formed on the whole surface and polished (over-polished) by the CMP method so that the second interlayer insulating film 17 is exposed. Thereafter, the base electrical conductive film 20 and the oxidation preventing film 21 are formed.

In the polishing step, there is a case where a recess portion 60 is formed in the W plug 19 and the polished surface is not flat as shown in FIG. 17A. When such a recess portion 60 is formed, the depth thereof is equal to about 20 nm to 50 nm, and it greatly affects the orientation of the lower electrode and the PZT film which are subsequently formed. Therefore, in this second embodiment, the base electrical conductive film 20 formed after the polishing is set to be large in thickness, whereby the recess portion 60 as described above is embedded.

In this case, after the polishing step to form the glue film 18 and the W plug 19, the $NH_3$ plasma treatment is conducted on the surface having the recess portion 60 formed therein. The $NH_3$ plasma treatment can be carried out under the same condition as described with reference to the first embodiment.

Figure 17B:
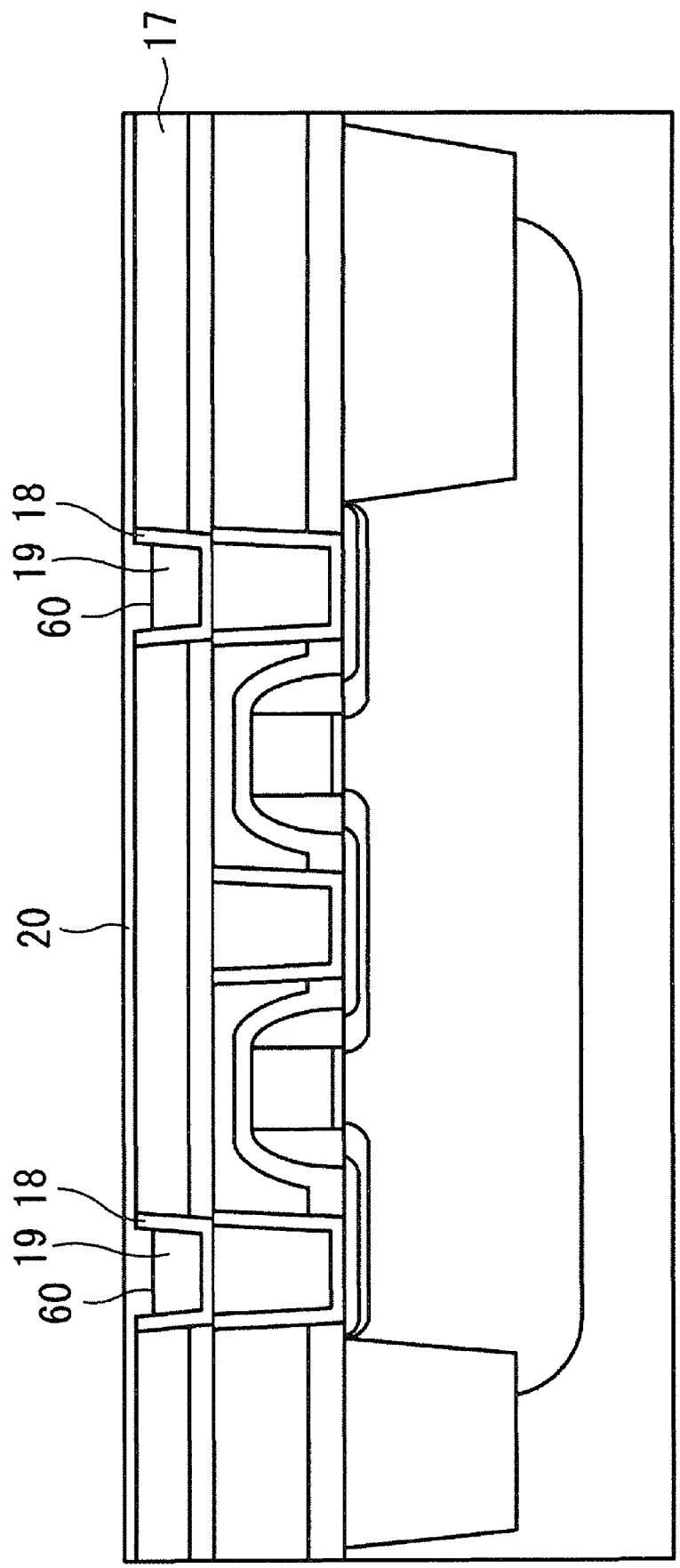

FIG. 17B is a schematic cross-sectional view of the main part of a base electrical conducive film forming step of the second embodiment.

After the $NH_3$ plasma treatment, for example, sputtering power of 2.6 kW is applied to the whole surface for 35 seconds at the substrate temperature of 20° C. under Ar atmosphere of 0.15 Pa by using a sputtering device in which the distance between the wafer to be treated and a target is set to 60 mm, thereby forming Ti film of 100 nm in film thickness which is preferentially oriented to the (002). Then, a RTA treatment is conducted at 650° C. under $N_2$ gas atmosphere for 60 seconds to form base electrical conductive film 20 formed of TiN film which is preferentially oriented to the (111). In this case, the base electrical conductive film 20 has a film thickness of about 10 nm. However, it is suitably set in the range from 100 nm to 300 nm in film thickness in accordance with the depth of the recess portion 60 or the like. The base electrical conductive film 20 is formed of TiN film in this embodiment, however, it may be formed of W film, Si film, Cu film or the like.

Immediately after the base electrical conductive film 20 is formed, a recess portion is also formed on the surface of the base electrical conductive film 20 while reflecting the recess portion 60, and thus the surface layer portion is polished by the CMP method subsequently to the formation of the base electrical conductive film 20, whereby the flat surface of the base electrical conductive film 20 which is suppressed from being affected by the recess portion 60 is obtained after the polishing. SSW2000 produced by Cabot Microelectronics Corporation is used for the polishing of the base electrical conductive film 20, for example. Furthermore, the film thickness of the base electrical conductive film 20 after the polishing is set to 50 nm to 100 nm, preferably to 50 nm.

When the surface portion of the base electrical conductive film 20 is polished as described above, distortion is liable to occur in the crystal in the neighborhood of the surface of the base electrical conductive film 20 after the polishing. Such distortion greatly affects the orientation of the lower electrode and the PZT film which will be subsequently formed. Therefore, the same $NH_3$ plasma treatment as described above is conducted on the surface of the base electrical conductive film 20 after the polishing, thereby removing the distortion occurring in the crystal in the neighborhood of the surface of the base electrical conductive film 20 after the polishing.

Through the above steps, the state as shown in FIG. 17B is obtained.

Figure 18:
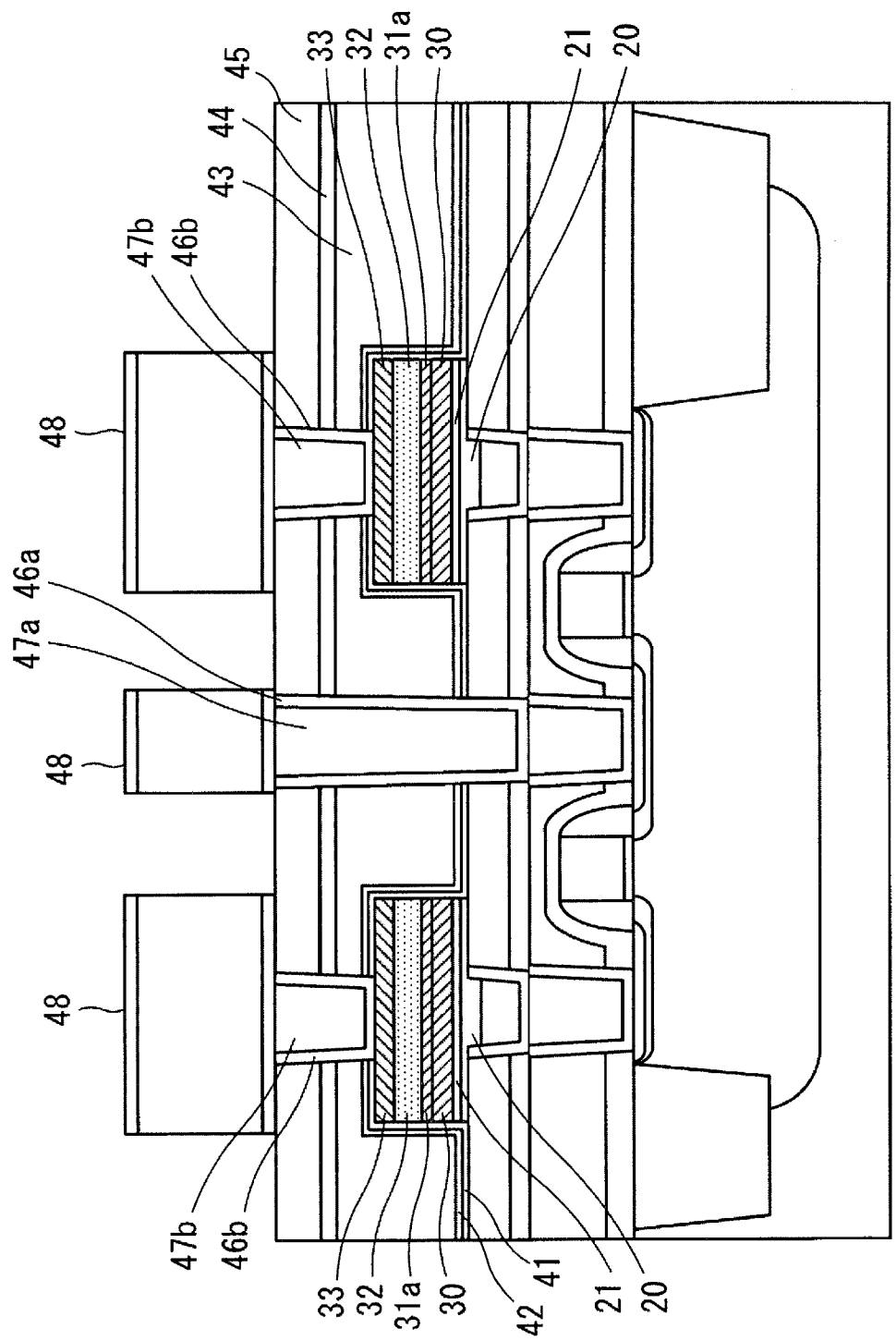
FIG. 18 is a schematic cross-sectional view of the main part of an FeRAM according to the second embodiment.

FIG. 18 is a schematic cross-sectional view of the main part of the FeRAM of the second embodiment.

After the polishing and the $NH_3$ plasma treatment have been performed as described above, the treatment is conducted along the same flow as the first embodiment.

First, the oxidation preventing film 21 is formed on the base electrical conductive film 20. Further, an Ir film 30, an $IrO_X$ film 31 (reduced to an Ir film 31a), a PZT film 32 and an upper electrode 33 are formed and subjected to patterning, and then the oxidation preventing film 21 and the base electrical conductive film 20 of the lower layer are subjected to patterning.

Thereafter, a first and second ALO film 41, 42, third interlayer insulating film 43, a barrier film 44, a fourth interlayer insulating film 45, a glue film 46a, 46b and W plugs 47a, 47b are formed, wires 48 are formed, and a wire layer of a first layer is formed, thereby obtaining a structure as shown in FIG. 18.

Subsequently, the wire layers of second and subsequent layers are likewise formed to the complete FeRAM.

According to the FeRAM forming method of the second embodiment, a flat ferroelectric capacitor having excellent orientation and suppressed dispersion can be obtained, and a high-performance and high-reliability FeRAM can be stably formed.

Next, a third embodiment will be described. In the description of the third embodiment, the same elements as described with reference to the second embodiment are represented by the same reference numerals.

Figure 19:
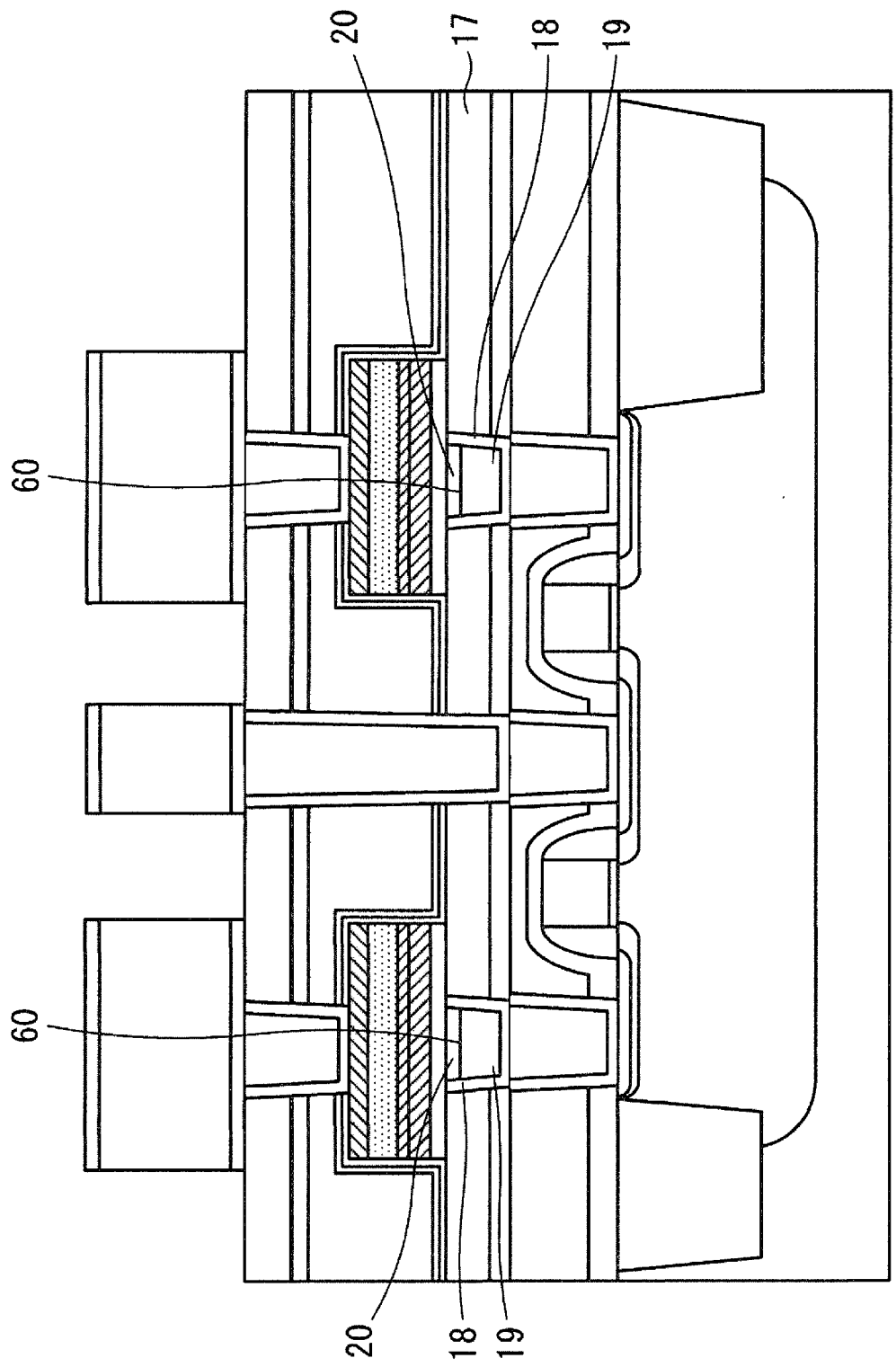
FIG. 19 is a schematic cross-sectional view of the main part of an FeRAM according to a third embodiment.

FIG. 19 is a schematic cross-sectional view of the main part of the FeRAM according to the third embodiment.

In the second embodiment, as shown in FIG. 17B, after the base electrical conductive film 20 is polished, all the second interlayer insulating film 17, the glue film 18 and the W plug 19 are covered by the base electrical conductive film 20.

On the other hand, in the third embodiment, the base electrical conductive film 20 is polished so that the second interlayer insulating film 17 is exposed, and after the polishing, only the recess portion 60 of the W plug 19 is embedded in the base electrical conductive film 20 as shown in FIG. 19. The subsequent steps are carried out along the same flow as the second embodiment.

According to the FeRAM forming method of the third embodiment, a flat ferroelectric capacitor having excellent orientation and suppressed dispersion can be obtained as in the case of the second embodiment.

Next, a fourth embodiment will be described. In the description of the fourth embodiment, the same elements as described in the first embodiment are represented by the same reference numerals.

Figure 20:
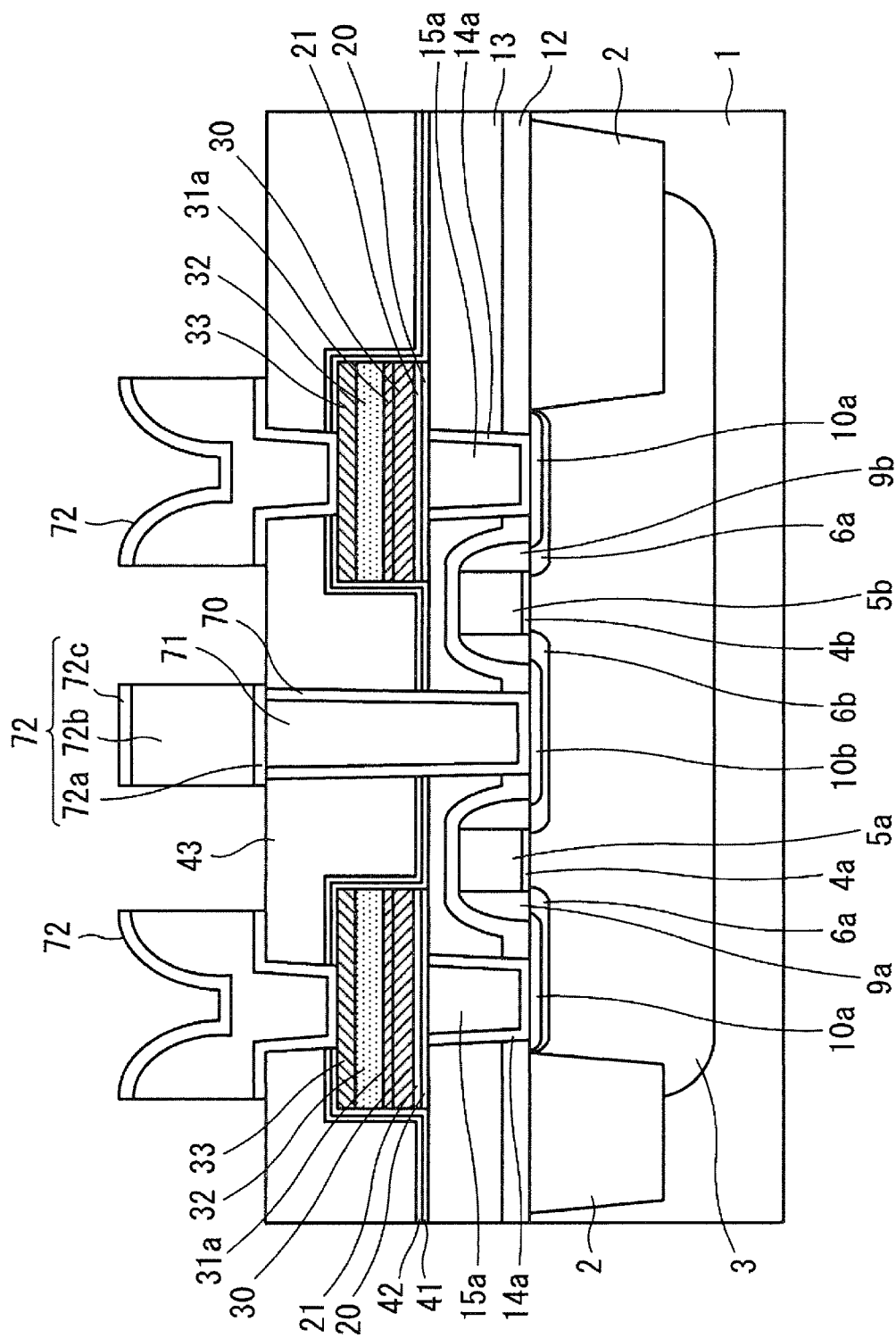
FIG. 20 is a schematic cross-sectional view of the main part of an FeRAM according to a fourth embodiment.

FIG. 20 is a schematic cross-sectional view of the main part of the FeRAM according to a fourth embodiment.

The FeRAM of the fourth embodiment is different from the FeRAM of the first embodiment in that the ferroelectric capacitor is formed on the glue film 14a and the W plug 15a through the base electrical conductive film 20 and the oxidation preventing film 21, and a wire 72 is directly formed on the ferroelectric capacitor. An FeRAM as described above can be formed as follows.

First, after the first interlayer insulating film 13 has been formed in the manner as described with respect to the first embodiment, the glue film 14a and the W plug 15a connected to the first source-drain region 10a are formed in the first interlayer insulating film 13. Then, the base electrical conductive film 20 and the oxidation preventing film 21 are formed on the first interlayer insulating film 13 having the glue film 14a and the W plug 15a formed therein. Subsequently, the Ir film 30, the $IrO_X$ film 31 (reduced to the Ir film 31a), the PZT film 32 and the upper electrode 33 are formed and subjected to patterning, and further patterning is conducted on the oxidation preventing film 21 and the base electrical conductive film 20 of the lower layer. Thereafter, the first and second ALO film 41, 42 and the third interlayer insulating film 43 are formed, and further a contact hole extending to the second source-drain region 10b is formed, and glue film 70 and a W plug 71 are formed. After a contact hole extending to the upper electrode 33 of the ferroelectric capacitor is formed, for example, a TiN/Ti stack film 72a, an AlCu alloy film 72 and a TiN/Ti stack film 72c are successively stacked in this order to form wires 72.

According to the FeRAM forming method of the fourth embodiment, a high-performance and high-reliability FeRAM can be formed as in the case of the first embodiment.

The first to fourth embodiments have been described above, however, the principle of forming the ferroelectric capacitor may be applied to not only an FeRAM adopting the stack structure described above, but an FeRAM adopting the planar structure likewise.

Furthermore, the present invention is not limited to the above embodiments, and these embodiments may be variously modified without departing from the subject matter of the present invention.

What is claimed is:

1. A method of manufacturing a semiconductor device comprising:
   forming a lower electrode over a substrate;
   heating the substrate with the lower electrode in a mixture gas atmosphere of inert gas and oxygen gas while increasing a temperature of the substrate until the temperature of the substrate reaches a specific temperature;
   forming a dielectric film with an organic metal raw material on the lower electrode after the temperature reaches the specific temperature; and
   forming an upper electrode on the dielectric film,
   wherein the process of forming the dielectric film includes
   forming an initial layer on the lower electrode using the organic metal raw material and oxygen gas, an amount of the oxygen gas is smaller than an amount required to react with the organic metal raw material; and
   forming a core layer on the initial layer using the organic metal raw material and oxygen gas, wherein the amount of the oxygen gas is larger than the amount required to react with the organic metal raw material.

2. The semiconductor device manufacturing method according to claim 1, wherein an oxygen gas rate in the mixture gas atmosphere is set to 30% or less.

3. The semiconductor device manufacturing method according to claim 2, wherein the oxygen gas rate is equal to 10% to 20%.

4. The semiconductor device manufacturing method according to claim 3, wherein the oxygen gas rate is equal to about 15%.

5. The semiconductor device manufacturing method according to claim 1, wherein the initial layer has a film thickness of 3 nm to 12 nm.

6. The semiconductor device manufacturing method according to claim 1, wherein the initial layer is formed at a forming speed of 0.1 nm/second or less.

7. The semiconductor device manufacturing method according to claim 1, wherein the core layer contains a larger amount of oxygen than the initial layer.

8. The semiconductor device manufacturing method according to claim 1, wherein the step of forming the dielectric film includes forming an amorphous dielectric surface layer portion on the core layer.

9. The semiconductor device manufacturing method according to claim 8, wherein the amorphous dielectric surface layer portion is formed by a sputtering method.

10. The semiconductor device manufacturing method according to claim 1, wherein after the dielectric film is formed, a heat treatment is conducted under an oxygen gas contained atmosphere.

11. The semiconductor device manufacturing method according to claim 1, wherein the lower electrode contains at least one of Ir, Rh, Pd and Ru.

12. The semiconductor device manufacturing method according to claim 1, wherein the step of forming the lower electrode includes forming a first metal film and forming a metal oxide film which is in amorphous or microcrystalline state on the first metal film.

13. The semiconductor device manufacturing method according to claim 12, wherein the dielectric film is formed on the metal oxide film while reducing the metal oxide film to a second metal film.

14. The semiconductor device manufacturing method according to claim 12, wherein the metal oxide film is a noble metal oxide film containing at least one of Ir, Rh, Pd and Ru.

15. The semiconductor device manufacturing method according to claim 1, wherein the specific temperature is substantially the same as the temperature at which the dielectric film is formed.

16. The semiconductor device manufacturing method according to claim 1, wherein the dielectric film is a ferroelectric film.

17. The semiconductor device manufacturing method according to claim 16, wherein the ferroelectric film contains Pb or Bi.

18. The semiconductor device manufacturing method according to claim 1, wherein the lower electrode is electrically connected to a transistor.

* * * * *